United States Patent
Hakamata et al.

(10) Patent No.: US 8,482,015 B2
(45) Date of Patent: Jul. 9, 2013

(54) LED LIGHT EMITTING APPARATUS AND VEHICLE HEADLAMP USING THE SAME

(75) Inventors: Shintaro Hakamata, Kiyosu (JP); Tatsuya Minato, Kiyosu (JP)

(73) Assignee: Toyoda Gosei Co., Ltd., Kiyosu-Shi (JP)

( * ) Notice: Subject to any disclaimer, the term of this patent is extended or adjusted under 35 U.S.C. 154(b) by 210 days.

(21) Appl. No.: 12/926,637

(22) Filed: Dec. 1, 2010

(65) Prior Publication Data
US 2011/0133217 A1    Jun. 9, 2011

(30) Foreign Application Priority Data

Dec. 3, 2009 (JP) ............................... P.2009-275281
Mar. 31, 2010 (JP) ............................... P.2010-080254

(51) Int. Cl.
*H01L 33/00* (2010.01)
*H01L 27/15* (2006.01)
*H01L 31/12* (2006.01)
*H01L 23/48* (2006.01)
*H01L 23/52* (2006.01)

(52) U.S. Cl.
USPC ................. 257/88; 257/79; 257/82; 257/784; 257/734

(58) Field of Classification Search
USPC ................... 257/88, 347, 99, 91, 98, 81, 668, 257/676, 691, 666, 690, 775, 749, 103, 94, 257/79, 82, 83, 95, 784, 734, 748
See application file for complete search history.

(56) References Cited

U.S. PATENT DOCUMENTS

| | | | | |
|---|---|---|---|---|
| 5,291,038 A | * | 3/1994 | Hanamoto et al. | 257/82 |
| 2006/0192223 A1 | | 8/2006 | Lee et al. | |
| 2010/0105156 A1 | * | 4/2010 | Chen et al. | 438/27 |

FOREIGN PATENT DOCUMENTS

| | | |
|---|---|---|
| JP | 2000-124508 A | 4/2000 |
| JP | 2002-156561 A | 5/2002 |
| JP | 2005-32661 A | 2/2005 |
| JP | 2006-245542 A | 9/2006 |
| JP | 2008-10545 A | 1/2008 |

\* cited by examiner

*Primary Examiner* — Chuong A. Luu
(74) *Attorney, Agent, or Firm* — McGinn IP Law Group, PLLC

(57) ABSTRACT

Four LED chips are mounted on a sub-mount substrate so as to be parallel thereto. A wire $9a$ is installed to extend between a pad electrode $7a$ of two pad electrodes $7a$, $7b$ provided in two diagonal corners of an upper surface of the LED chip 1 which pad electrode $7a$ is disposed on a first edge $1a$ side of the LED chip 1 and a bonding area of a conductive pattern 13 so as to be inclined at 15 to 40 degrees towards an orientation which moves away from a first edge $1a$ with respect to an orthogonal moving-away direction D relative to the first edge $1a$. A wire $9b$ is installed to extend between the pad electrode $7b$ which is disposed on a second edge $1b$ side of the LED chip 1 and a bonding area of the conductive pattern 1 so as to be inclined 15 to 40 degrees towards an orientation which approaches a second edge $1b$ of the LED chip 1 with respect to an orthogonal moving-away direction D relative to the second edge $1b$.

13 Claims, 18 Drawing Sheets

US 8,482,015 B2

LED LIGHT EMITTING APPARATUS AND VEHICLE HEADLAMP USING THE SAME

BACKGROUND

1. Field of the Invention

The present invention relates to an LED light emitting apparatus in which LED chips are mounted on a substrate and a vehicle headlamp using the same.

2. Description of the Related Art

Enlarging LED chips (500 μm to 1 mm long on one edge) is propagated to allow a large current to flow for high light output and/or to cause them to be driven in low-current regions of high luminous efficiency by reducing a current density per area, and a plurality of pad electrodes for wire bonding are formed on a wide area of light emitting surface of such an LED chip for uniform current supply (Patent Documents 1, 2).

A conventional example 1 shown in FIG. 15 is an LED light emitting apparatus 210 in which four large LED chips 201 are mounted on a sub-mount substrate of a required minimum size for mounting the LED chips 201 in a row to form a single series circuit. Formed on a light emitting surface of the LED chip 201 are two pad electrodes 202 lying in corners of one edge and finger electrodes (whose illustration is omitted) which extend linearly from both the pad electrodes 202 so as to scatter on the light emitting surface. The sub-mount substrate is a wiring board or printed circuit board which is made up of a ceramic board 212 and five conductive patterns 213 which are formed on an upper surface of the circuit board. One LED chip 201 is disposed on each of lower four patterns, and the LED chips 201 so disposed are electrically and thermally joined to the corresponding patterns on their lower surfaces. Two wires 209, 209 are installed to extend, respectively, from the two pad electrodes 202, 202 of each LED chip 201 so as to be placed in bonding areas of the next upper conductive pattern 213 in FIG. 13 for bonding. The installing directions of the wires 209, 209 from the pad electrodes 202, 202 when viewed from thereabove are orthogonal moving-away directions relative to facing edges 201a, 201b of each LED chip 201 (directions in which the wires move away at right angles to the facing edges 201a, 201b. This will be true below). Because of this, a pattern width of the conductive pattern 213 where ends of the two wires 209, 209 are bonded is increased, leading to a problem that the size of the sub-mount substrate 211 is increased.

A conventional example 2 shown in FIG. 16 is an LED light emitting apparatus in which the conventional example 1 is arranged in double rows, that is, eight LED chips 201 are mounted on a sub-mount substrate 221 so as to be arranged in two rows to form two series circuits. An installing direction of wires 209, 209 is similar to that of the conventional example 1. An inter-chip-space is increased because wires from one row are aligned with wires from the other row between the two rows of LED chips 201 in an end-to-end fashion, leading to a problem that the size of the sub-mount substrate 221 is also increased.

A conventional example 3 shown in FIG. 17 is an LED light emitting apparatus 230 in which eight LED chips 201 are mounted on a base substrate 231 including receiving terminals for contact with feeding terminals of an illumination appliance so as to be arranged in two rows to form two series circuits. An installing direction of wires 209, 209 is similar to that of the conventional example 1. For example, two anode patterns 233a and one common cathode pattern 233c of conductive patterns 213 are extended from a lower edge or a mounting edge of the LED light emitting apparatus 230, and respective extended end portions are made to function as receiving terminals. The two anode patterns 233a are positioned at a left-hand edge and a center of the mounting edge, and the cathode common pattern 233c is positioned at a right-hand edge of the mounting edge. When the LED chips of the two circuits are driven at the same time, more current is caused to flow through the cathode common pattern 233c than each of the anode patterns 233a. Therefore, a voltage drop in the cathode common pattern 233c becomes large due to an internal resistance thereof. Consequently, the cathode common pattern 233c should be formed wider than each anode pattern 233a so as to reduce the internal resistance thereof. However, feeding terminals provided on a mounting holder of the illumination appliance are disposed at equal intervals, and their positions are determined and cannot be changed in many cases. In some cases, this prevents a sufficient extension of the width of the cathode common pattern 233c. Namely, even when attempting to extend the width of the cathode common pattern 233c disposed at the right-hand edge of the mounting edge, the cathode common pattern 233c must not be extended in such an extent that it contacts or overlaps the central feeding terminal 236, and hence, there is a limitation on the extension of the cathode common pattern 233c.

A conventional example shown in FIG. 18 is a vehicle headlamp 240 which employs the LED light emitting apparatus 210 described in the conventional example 1. In this vehicle headlamp 240, the LED light emitting apparatus 210 of the conventional example 1 is mounted on a base substrate 241 with receiving terminals with its upper surface oriented upwards so that light is emitted upwards from the light emitting surfaces of the LED chips or to the peripheries thereof. A reflector 242 is provided at the rear (to the left in FIG. 18) of the LED light emitting apparatus 210 so as to extend around the LED chips 201 so that light emitted upwards or to the peripheries of the light emitting surfaces of the LED chips 201 is reflected to the front. Then, a forward illumination lens (whose illustration is omitted) is provided ahead of the LED light emitting apparatus 210 so as to collect the light reflected to the front within a predetermined range.

In addition, the LED light emitting apparatus 210 is disposed so that the orthogonal moving-away direction relative to first edge 201a of each LED chip 201 constitutes a directly rearward direction directed towards the reflector 242. As has been described above, the installing direction of the wire 209 extended from the pad electrode 202 disposed on the first edge 201a side of each LED chip 201 is the orthogonal moving-away direction relative to the first edge 201a of the LED chip 201. Consequently, the wire 209 enters in parallel an optical path directed rearwards from the LED chip 201 towards the reflector 242, generating a shadow of the wire 209. The shadow of the wire 209 then causes a problem that the quantity of light emitted from the LED chip 209 is reduced or an external appearance of the vehicle headlamp 240 is deteriorated as a result of the shadow being visible from an external location.

Patent Document 1 describes a vehicle headlamp in which light emitted upwards from light emitting surfaces of LED chips or to the peripheries thereof is reflected to the front by a reflector. However, bonding wires of the LED chips pass across a forward direction which is a light shining direction. In addition, there are described therein neither a form in which a plurality of pad electrodes are provided on the light emitting surfaces of the LED chips nor a form in which pad electrodes are provided in two diagonal corners of the light emitting surfaces of the LED chips, in particular. Patent Document 3 describes a form in which pad electrodes are provided in two diagonal corners of light emitting surfaces of LED chips. As a result of the LED chips being mounted obliquely on a substrate, bonding wires are installed in an inclined fashion. However, a problem described in the document as one that the invention is to solve is to perform smoothly a wire bonding operation, and hence, both the problem and configuration of that particular invention are different from those of this invention.

Patent Document 1: JP-A-2005-32661
Patent Document 2: JP-A-2006-245542
Patent Document 3: JP-A-2000-124508

SUMMARY OF THE INVENTION

A first object of the invention is, in an LED light emitting apparatus with LED chips mounted on a substrate, to reduce the size of the substrate by reducing a width of bonding areas of conductive patterns on the substrate where wires are bonded and further, when the LED chips are disposed in a plurality of rows, to reduce an inter-chip-space between the rows of LED chips.

A second object of the invention is, in an LED light emitting apparatus with LED chips mounted on a substrate, to reduce electric resistance so as to make a voltage drop small by increasing a width of a common pattern for conductive patterns on the substrate.

A third object of the invention is, in a vehicle headlamp which employs an LED light emitting apparatus with LED chips mounted on a substrate and reflects to the front light emitted upwards from light emitting surfaces of the LED chips or to the peripheries thereof by a reflector, to prevent wires from entering optical paths directed from the LED chips towards the reflector to prevent the generation of shadows of the wires in the optical paths so as to eventually prevent a reduction in light quantity and deterioration of an external appearance of the headlamp.

With a view to attaining the objects above, the following measures (1) to (5) are taken in the invention as aspects thereof.

(1) According to a first aspect of the invention, there is provided an LED light emitting, comprising:

a substrate having a first edge and a second edge that is faced to the first edge and parallel to the first edge, and a conductive pattern provided on an upper surface of the substrate, the conductive pattern having a first bonding area which lies on a first edge side of the substrate and a second bonding area which lies on a second edge side of the substrate;

an LED chip having a first edge and a second edge that is faced to the first edge and parallel to the first edge, and having a first pad electrode which lies on a first edge side of the LED chip, and a second pad electrode which lies on a second edge side of the LED chip, the first and second pad electrodes being provided on two diagonal corners of an upper surface of the LED chip, the LED chip being mounted on the substrate so that the first edge of the LED chip and the first edge of the substrate become parallel to each other at intervals and the second edge of the LED chip and the second edge of the substrate become parallel to each other at intervals;

a first wire installed between the first pad electrode and the first bonding area; and a second wire installed between the second electrode and the second bonding area;

wherein an installing direction of the first wire from the first pad electrode, as viewed from thereabove, constitutes a direction which is inclined at 15 to 40 degrees towards an orientation which moves away from the first edge of the LED chip with respect to a first orthogonal moving-away direction that is orthogonal to the first edge of the LED chip and toward the first edge of the substrate from the first edge of the LED chip; and wherein an installing direction of the second wire from the second pad electrode, as viewed from thereabove, constitutes a direction which is inclined at 15 to 40 degrees towards an orientation which approaches the second edge of the LED chip with respect to a second orthogonal moving-away direction that is orthogonal to the second edge of the LED chip and toward the second edge of the substrate from the second edge of the LED chip.

(2) According to a second aspect of the invention, there is provided an LED light emitting apparatus as set forth under the first aspect of the invention, a plurality of the LED chips are mounted on the substrate in a straight line so that first edges of the plurality of LED chips are aligned with each other so that the plurality of LED chips configure a series circuit.

(3) According to a third aspect of the invention, there is provided an LED light emitting apparatus as set forth under the first aspect of the invention, a plurality of the LED chips that are comprised of a first LED chip and a second LED chip are mounted on the substrate in rows so that as that the plurality of LED chips configure parallel circuits and a second edge of the first LED chip and a first edge of the second LED chip are parallel to each other at intervals.

(4) According to a fourth aspect of the invention, there is provided an LED light emitting apparatus as set forth under the first aspect of the invention, a third edge of the substrate is made to function as a mounting edge where the apparatus is mounted on an illumination apparatus, and a common pattern at one polarities of the parallel circuits is disposed at a central portion of the mounting edge and two patterns at the other polarities of the parallel circuits are disposed at both end portions of the mounting edge which face each other with the central portion put between the both end portions.

(5) According to a fifth aspect of the invention, there is provided an LED light emitting apparatus as set forth under the third or fourth aspect of the invention, the LED light emitting apparatus set forth in any of the first to fifth aspects of the invention is disposed with an upper side thereof oriented upwards so that light is emitted upwards from the upper surfaces of the LED chip or to the peripheries of the LED chip;

wherein a reflector is provided at the rear of the LED light emitting apparatus so as to extend around the LED chip so as to reflect forwards the light emitted upwards or to the peripheries of the upper surfaces; and the LED light emitting apparatus is disposed so that the first orthogonal moving-away direction relative to the first edge of the LED chip constitutes a directly rearward direction which is directed from the LED chip to the reflector such that the first wire installed to extend from the first pad electrode disposed on the first edge side of the LED chip is prevented from entering optical paths directed from the LED chip to the reflector.

Hereinafter, reasons, examples and preferred forms of the respective elements of the measures described above will be described.

1. LED Chip

Any LED chip may be used, provided that at least two pad electrodes are provided in diagonal corners of an upper surface thereof, and any form may be adopted of a form in which the two pad electrodes are both negative electrodes, a form in which the two pad electrodes are both positive electrodes and a form in which the two pad electrodes constitute a combination of a negative electrode and a positive electrode. When both the two pad electrodes are electrodes of the same polarity, the other polarity can be provided on a lower surface of the LED chip. As this occurs, a conductive support substrate is provided.

The Chip including a conductive support substrate provided on a lower surface of the LED chip are preferable. A fabrication method employing the LLO (Laser Lift Off) method is preferable. A chip (LLO chip) fabricated by the LLO method is such that only an upper surface of an extremely thin semiconductor layer constitutes a light emitting surface with little light emitted sideways from lateral side surfaces thereof. Therefore, since the chip has a narrower orientation (FWHM) and a higher luminous intensity than those of other chips, light is easily shone onto the reflector and the chip is easy to be controlled optically. On the other hand, although chips including a transparent substrate made of sapphire or GaN are applicable, since light is also emitted from lateral side surface of the substrate when light is guided therethrough, its orientation becomes wider.

Although there is no specific limitation imposed on size, to cope with a large current and/or to cause the chip to be driven in a small current region with high luminous efficiency by decreasing the current density, a large chip is preferable which has a rectangular shape with one edge measured between 500 μm to 1.5 mm.

There is no specific limitation imposed on the color of light emitted. However, light rays can be raised as examples which have their peak wavelength in the red wavelength range, green wavelength range, blue wavelength range, violet wavelength range or ultraviolet wavelength range. In the case of a white color being obtained together with luminescent light by exciting a luminescent material provided in the vicinity of the LED chip, a light ray is preferably adopted which has its peak wavelength in the blue wavelength range, the violet wavelength range or ultraviolet wavelength range (in particular, in the case of the vehicle headlamp described under (6) above).

There is no specific limitation imposed on the material of a semiconductor layer to be used. However, there can be raised as examples gallium nitride (GaN) based materials, zinc oxide (ZnO) based materials, zinc selenide (ZnSe) based materials and silicon carbide (SiC) based materials.

There is no specific limitation on the type of a light emitting layer to be used. However, in order to obtain high luminous efficiency, a multiple quantum well type layer is preferable.

2. Substrate

There is no specific limitation on a substrate to be used. For example, a sub-mount substrate may be used which has a required minimum size for mounting a required number of LED chips. Alternatively, a base substrate may be used which includes receiving terminals for contact with feeding terminals of an illumination appliance. There is no specific limitation imposed on the material of a substrate to be used. However, there can be raised as examples such ceramic materials as aluminum nitride, alumina and boron nitride.

3. Wire

The following are reasons that the installing direction of the wire installed to extend from the pad electrode on the first edge side of the LED chip constitutes the direction inclined at 15 to 40 degrees towards the orientation which moves away from the first edge with respect to the orthogonal moving-away direction relative to the first edge and the installing direction of the wire installed to extend from the pad electrode on the second edge side of the LED chip constitutes the direction inclined at 15 to 40 degrees towards the orientation which approaches the second edge with respect to the orthogonal moving-away direction relative to the second edge.

In many cases, the LED light emitting apparatus set forth under (1) and (2) above is used in the vehicle headlamp set forth under (6) above so that light emitted upwards from the upper surfaces of the LED chips or to the peripheries thereof is reflected to the front by the reflector.

In this case, in the event that the first edge is disposed to face the reflector, of the wire which extends from the pad electrode on the first edge side, in particular, a portion which just rises from the pad electrode tends to be easily positioned on the optical path of light which is emitted rearwards towards the reflector and obliquely upwards. Then, the installing direction of the wire is inclined towards the orientation which moves away from the first edge with respect to the orthogonal moving-away direction D so that the portion of the wire is not positioned on the optical axis. The reason that the inclination angle falls within the range from 15 to 40 degrees is that in the event that the inclination angle is less than 15 degrees, in the measures described under (1) to (3), the function and advantage of reducing the width of the bonding areas of the conductive pattern are reduced. On the contrary, in the event that the inclination angle exceeds 40 degrees, when the series circuit or circuits are formed by mounting the plurality of LED chips into the row or rows as is described under (2), there is caused a fear that the wire is positioned on the optical path of light emitted from the adjacent LED chip towards the reflector. The inclination angle is preferably in the range of 20 to 40 degrees.

On the other hand, in light emitted to the front from the LED chip, light emitted directly to the front is used mainly, and light emitted obliquely upwards is not much used. Of the wire which extends from the pad electrode on the second edge side, in particular, a portion which just rises from the pad electrode is made difficult to be positioned on the optical path of light which is emitted directly to the front. The installing direction of the wire 9*b* is inclined towards the orientation which approaches the second edge with respect to the orthogonal moving-away direction so that distal ends on the conductive pattern side of the wire extending from the pad electrode on the first edge side and the wire extending from the pad electrode on the second edge side are prevented from being spaced too far away from each other, whereby the conductive pattern is made easy to be provided. The reason that the inclination angle falls within the range of 15 to 40 degrees is that in the event that the inclination angle is less than 15 degrees, in the measures described under (1) to (3), the function and advantage of reducing the width of the bonding areas of the conductive pattern are reduced. On the contrary, in the event that the inclination angle exceeds 40 degrees, of the wire extending from the pad electrode on the second edge side, a portion spaced away from the same pad electrode tends to be positioned on the optical path of light which is emitted directly to the front. Thus, the inclination angle is preferably in the range of 20 to 40 degrees.

4. Illumination Appliance

There is no specific limitation imposed on an illumination appliance which employs the LED light emitting apparatus of the invention and hence can be applied to a vehicle headlamp, a building illumination lamp and a projector lamp as examples.

According to the first to fourth aspect of the invention, in the LED light emitting apparatus in which the LED chip or chips are mounted on the substrate, the size of the substrate can be reduced by reducing the widths of the bonding areas of the conductive patterns where the wires are bonded. Further, in the event that the LED chips are arranged into the plurality of rows, the inter-chip-space can be reduced.

According to the fourth aspect of the invention, in addition to the advantage provided by the first or second aspect of the invention, the width of the common pattern for the conductive patterns on the substrate can be increased, whereby the electric resistance can be reduced so as to make the voltage drop small.

According to the fifth aspect of the invention, in addition to the advantage provided by the first or second aspect of the invention, in the vehicle headlamp in which light emitted upwards from the light emitting surfaces of the LED chips or to the peripheries thereof is reflected to the front by the reflector, the wires are prevented from entering the optical paths directed from the LED chips to the reflector so as to prevent the generation of shadows of the wires, whereby the reduction in light quantity and deterioration in the external appearance of the vehicle headlamp can be prevented.

DESCRIPTION OF THE PREFERRED EMBODIMENTS

Embodiment 1

Figure 1:
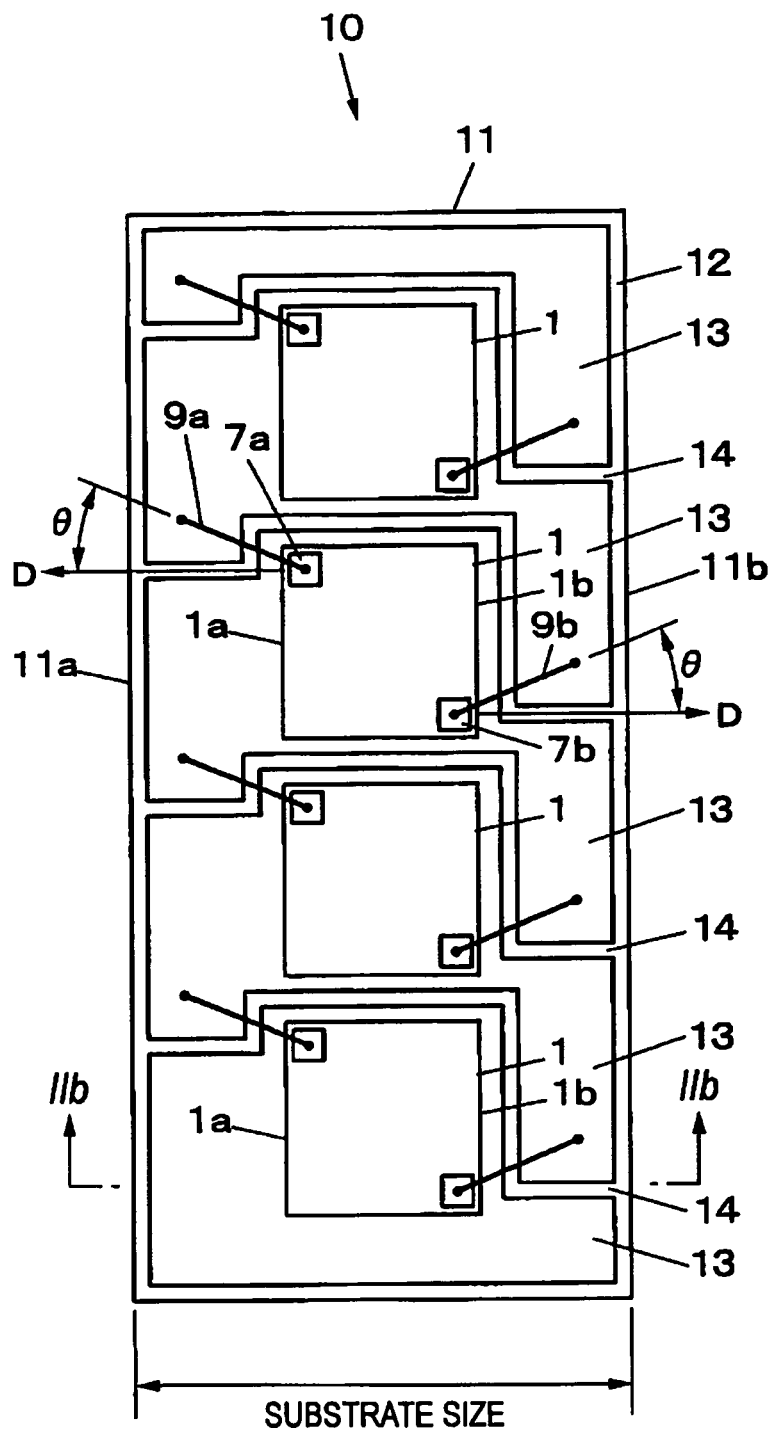
FIG. 1 is a plan view of an LED light emitting apparatus of Embodiment 1.
Figure 2:
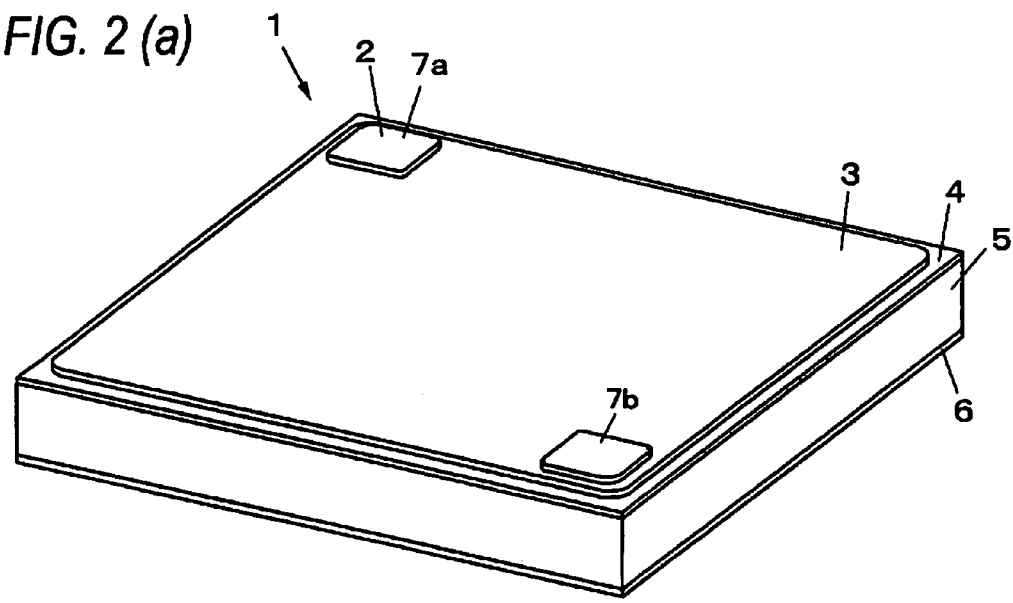
FIG. 2(a) is a perspective view of an LED chip used in the LED light emitting apparatus of Embodiment 1.
FIG. 2(b) is a sectional view taken along the line 11b-11b in FIG. 1.
Figure 2:
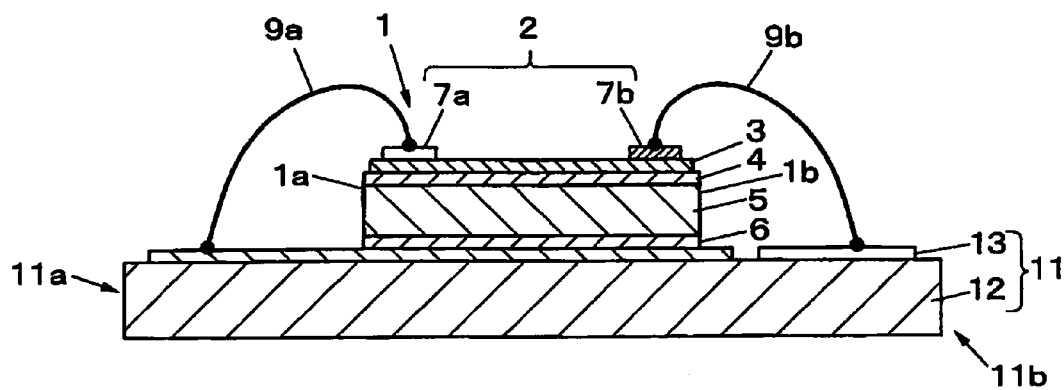

Embodiment 1 shown in FIGS. 1 and 2 is an LED light emitting apparatus 10 in which four LED chips are mounted into a single row on a sub-mount substrate 11 having a required minimum size to mount the four LED chips thereon so as to form a single series circuit.

LED chips each having a square shape of 1 mm by 1 mm as viewed from thereabove are used for the LED chips used in Embodiment 1. In FIG. 1, a first edge 1a and a second end 1b which face each other in a left-right direction are parallel. In addition, those fabricated by use of the LLO (Laser Lift Off) method are used as the LED chips. As is shown in FIG. 2, the LED chip includes sequentially from top to bottom an n electrode 2, a semiconductor layer 3, a conductive adhesive layer 4, a conductive substrate 5 and a p electrode layer 6. The semiconductor layer 3 includes sequentially from top to bottom an n-type cladding layer, a multiple quantum well type light emitting layer and a p-type cladding layer (whose illustration is omitted). The semiconductor layer 3 is formed over a wide area which expands almost all over the square shape. To supply a current uniformly to an upper surface of the n-type cladding layer which constitutes a light emitting surface of the LED chip 1, the n electrode 2 includes two wire bonding pad electrodes 7a, 7b which are provided in two diagonal corners of the upper surface of the semiconductor layer 3 which constitutes the light emitting surface and finger electrodes (whose illustration is omitted) which extend linearly from the pad electrodes 7a, 7b so as to scatter on the upper surface. The p electrode 6 is provided over the entirety of a lower surface of the conductive substrate 5. The LED chip 1 is not limited to the LED chip described above, provided that an LED chip has at least two pad electrodes in two diagonal corners on an upper surface thereof. For example, an LED chip may be adopted in which a p electrode is provided on an upper surface and an n electrode is provided on an opposite surface. Alternatively, an LED chip may be adopted in which a p electrode and an n electrode are provided on a light emitting surface.

The sub-mount substrate 11 is a wiring board or printed circuit board which is made up of an insulating and highly heat conducting ceramic plate 12 (of aluminum nitride, for example) and conductive patterns 13 which are formed on an upper surface of the ceramic plate 12. As viewed from thereabove, the sub-mount substrate 11 has a rectangular shape, and a first edge 11a and a second edge 11b, which face each other laterally in FIG. 1, are parallel. Five conductive patterns 13 are aligned into a row with insulating areas 14 defined therebetween. The LED chips 1 are placed individually on four lower ones of the five conductive patterns, and lower surfaces of the p electrodes 6 are entirely joined to the corresponding conductive patterns 13 electrically and thermally. Two wires 9a, 9b are installed to extend, respectively, from the two pad electrodes 7a, 7b of the n electrode of each LED chip 1 to bonding areas of the upwardly adjacent conductive pattern in FIG. 1 for bonding. The wires 9a, 9b are gold wires, for example. By this configuration, the LED light emitting apparatus 10 is configured in which the four LED chips 1 are disposed in a row and are mounted so as to form a single series circuit. In the conductive patterns 13, the lowermost conductive pattern constitutes an anode, whereas the uppermost conductive pattern constitutes a cathode.

Embodiment 1 is characterized by the following points.

The four LED chips 1 are mounted on the sub-mount substrate so that the respective first edges 1a of the LED chips 1 and the first edge 11a of the sub-mount substrate 11 are parallel with a space defined therebetween and the respective second edges 1b of the LED chips 1 and the second edge 11b of the sub-mount substrate 11 are parallel with a space defined therebetween. The four LED chips are arranged in the row so that the first edges 1a thereof are aligned with each other in an end-to-end fashion into a straight line.

The wire 9a is installed to extend between the pad electrode 7a of the two pad electrodes 7a, 7b provided in the two diagonal corners of the upper surface of the LED chip 1 which pad electrode pad 7a faces the first edge 1a of the LED chip 1 and the bonding area of the conductive pattern 13 which is provided on the upper surface of the sub-mount substrate 11 in a position lying on a first edge 11a side thereof. An installing direction of the wire 9a from the pad electrode 7a as viewed from thereabove constitutes a direction which is inclined at 15 to 40 degrees (an inclination angle θ) (at 20 to 25 degrees in the illustrated example) towards an orientation which moves away from the first edge 1a with respect to an orthogonal moving-away direction D of the wire 9a relative to the first edge 1a (that is, a direction that is orthogonal to the first edge 1a of the LED chip 1 and toward the first edge 11a of the sub-mount substrate 11 from the first edge 1a of the LED chip 1.).

The wire 9b is installed to extend between the pad electrode 7b of the two pad electrodes 7a, 7b which faces the second edge 1b of the LED chip 1 and the bonding area of the conductive pattern 13 which is provided on the upper surface of the sub-mount substrate 11 in a position lying on a second edge 11a side thereof. An installing direction of the wire 9b from the pad electrode 7b as viewed from thereabove constitutes a direction which is inclined at 15 to 40 degrees (an inclination angle θ) (at 20 to 25 degrees in the illustrated example) towards an orientation which approaches the second edge 1b with respect to an orthogonal moving-away direction D of the wire 9b relative to the second edge 1b (that is, a direction that is orthogonal to the second edge 1b of the LED chip 1 and toward the second edge 11b of the sub-mount substrate 11 from the second edge 1b of the LED chip 1.).

Figure 10:
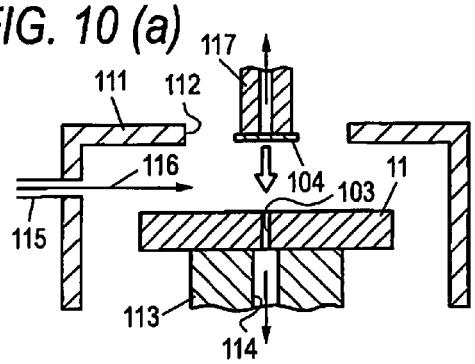
FIGS. 10(a) to (h) show sectional views depicting a process of joining a LED chip to a sub-mount substrate with an AuSn sheet-shaped pre-form.
Figure 10:
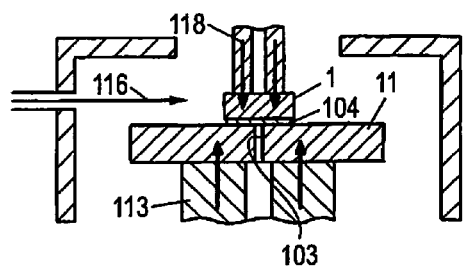
Figure 10:
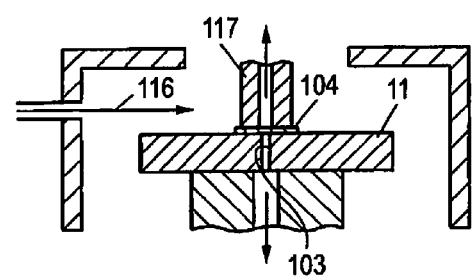
Figure 10:
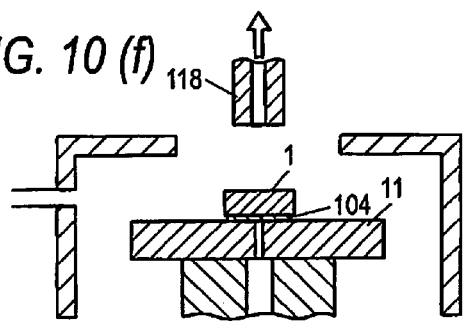
Figure 10:
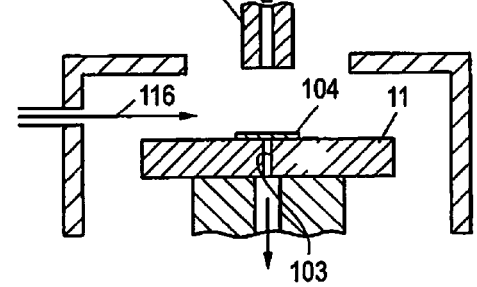
Figure 10:
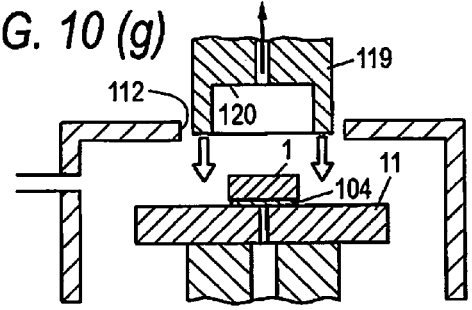
Figure 10:
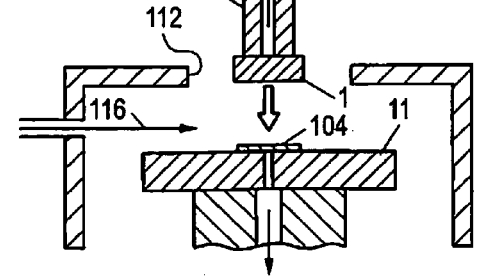
Figure 10:
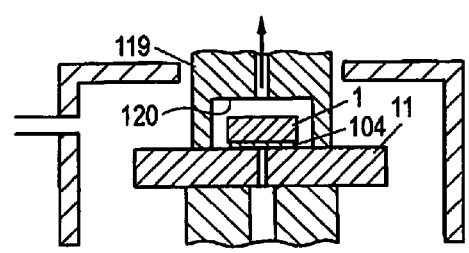

In this way, since the installing directions of the wires 9a, 9b from the pad electrodes 7a, 7b, respectively, as viewed from thereabove are the directions which are inclined at 15 to 40 degrees with respect to the orthogonal moving-away directions relative to the first edge 1a and the second edge 1b, compared with the conventional example 1 shown in FIG. 10, the widths of the bonding areas of the conductive pattern 13 where the ends of the wires 9a, 9b are bonded can be reduced so as to reduce the size of the sub-mount substrate 11.

Embodiment 2

Figure 3:
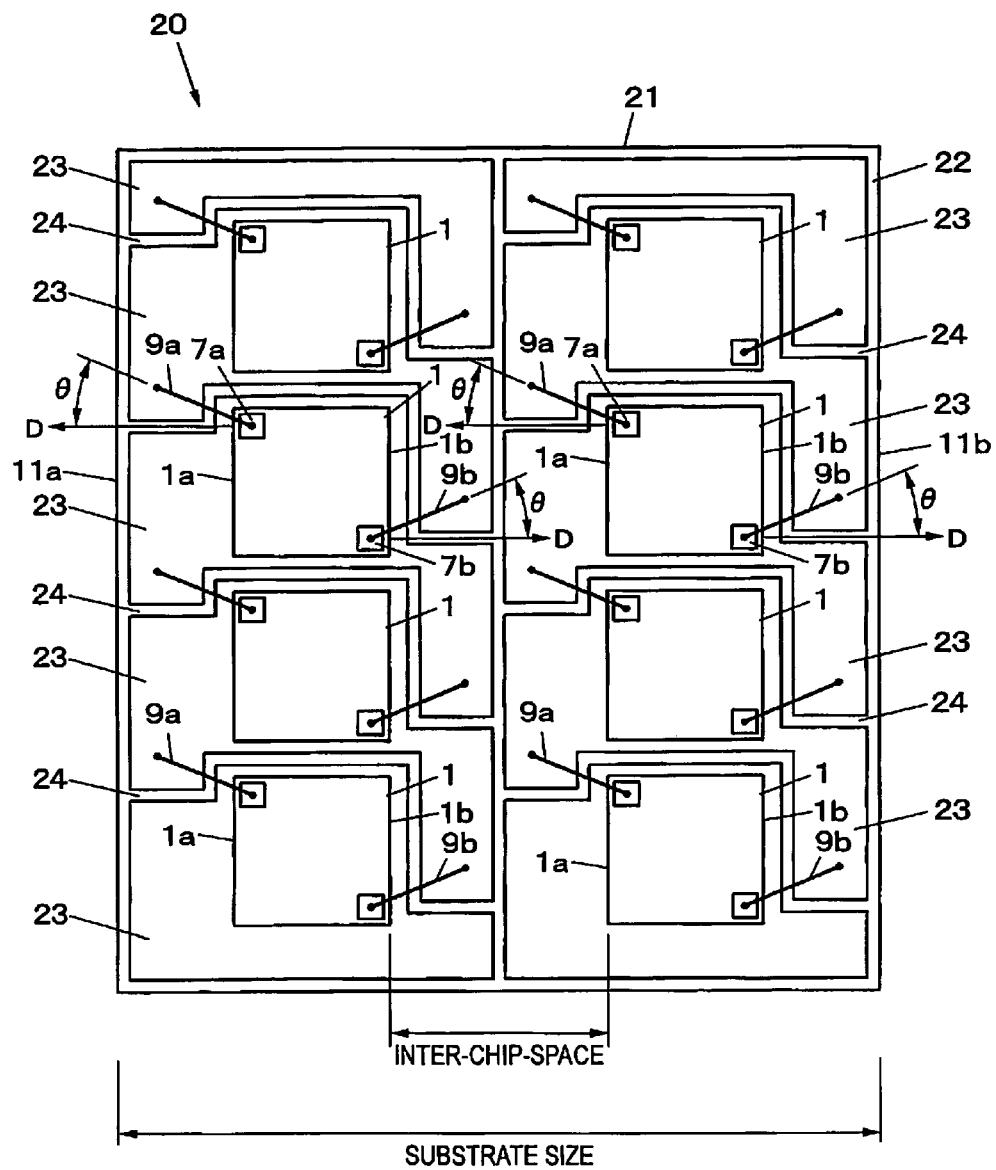
FIG. 3 is a plan view of an LED light emitting apparatus of Embodiment 2.

Embodiment 2 shown in FIG. 3 is an LED light emitting apparatus 20 in which eight LED chips 1 are mounted on a sub-mount substrate 21 having a required minimum size to mount the eight LED chips 1 thereon into two rows so as to form two series circuits.

The LED chips 1 used in Embodiment 2 are the same as the LED chips 1 used in Embodiment 1. In FIG. 3, four LED chips 1 in a left row are referred to as first LED chips, and four LED chips 1 in a right row are referred to as second LED ships.

The sub-mount substrate 21 is a wiring board or printed circuit board which is made up of an insulating and highly heat conducting ceramic plate 22 (of aluminum nitride, for example) and conductive patterns 23 which are formed into wiring patterns on an upper surface of the ceramic plate 22. As viewed from thereabove, the sub-mount substrate 21 has a rectangular shape, and a first edge 21a and a second edge 21b, which face each other laterally in FIG. 3, are parallel. 10 conductive patterns 23 are arranged into two rows of five conductive patterns which are aligned in parallel laterally, and in each row the five conductive patterns 23 are aligned into a straight line with insulating areas 24 defined therebetween. The LED chips 1 are placed individually on eight lower ones of the ten conductive patterns, and lower surfaces of p electrodes 6 are entirely joined to the corresponding conductive patterns 23 electrically and thermally. Two wires 9a, 9b are installed to extend, respectively, from two pad electrodes 7a, 7b of an n electrode of each LED chip 1 to the upwardly adjacent conductive pattern 23 in FIG. 3 for bonding. By this configuration, the LED light emitting apparatus 20 is realized in which the eight LED chips 1 are disposed in the two rows and are mounted so as to form two single series circuits. In the conductive patterns 23, the two lowermost conductive patterns 23 each constitute an anode, whereas the two uppermost conductive patterns 23 each constitute a cathode. The two anode patterns may be combined so as to form one common anode pattern, or the two cathode patterns may be combined so as to form one cathode common pattern.

Embodiment 2 is characterized by the following points.

The four first LED chips 1 and the four second LED chips 1 are mounted on the sub-mount substrate 21 so that first edges 1a of the first LED chips 1 and the first edge 21a of the substrate 21 become parallel with a space defined therebetween, second edge 1b of the first LED chips 1 and first edges 1a of the second LED chips 1 become parallel with a space defined therebetween and second edges 1b of the second LED chips 1 and the second edge 21b of the sub-mount substrate 21 become parallel with a space defined therebetween. The four first LED chips 1 are arranged into the row so that the first edges 1a are aligned in an end-to-end fashion with each other into a straight line. The four second LED ships 1 are also arranged into the row so that the first edges 1a are aligned in an end-to-end fashion with each other into a straight line.

The wire 9a is installed between the pad electrode 7a of the two pad electrodes 7a, 7b provided in two diagonal corners of an upper surface of the first LED chip 1 which lies on a first edge 1a side of the LED chip 1 and a bonding area of the conductive pattern 23 provided on an upper surface of the sub-mount substrate 21 in a position lying on a first edge 21a side thereof so that an installing direction of the wire 9a from the pad electrode 7a as viewed from thereabove constitutes a direction which is inclined at 15 to 40 degrees towards an orientation which moves away from the first edge 1a of the first LED chip 1 with respect to an orthogonal moving-away direction of the wire 9a relative to the first edge 1a of the first LED chip 1.

The wire 9b is installed between the pad electrode 7b of the two pad electrodes 7a, 7b provided in the two diagonal corners of the upper surface of the first LED chip 1 which lies on a second edge 1b side of the first LED chip 1 and a bonding area of the conductive pattern 23 which is provided on the upper surface of the sub-mount substrate 21 in a position lying closer to the first LED chip 1 within the space defined between the first and second LED chips 1 so that an installing direction of the wire 9b from the pad electrode 7b as viewed from thereabove constitutes a direction which is inclined at 15 to 40 degrees towards an orientation which approaches the second edge 7b of the first LED chip 1 with respect to an orthogonal moving-away direction of the wire 7b relative to the second edge 1b of the first LED chip 1.

The wire 9a is installed between the pad electrode 7a of two pad electrodes 7a, 7b provided in two diagonal corners of an upper surface of the second LED chip 1 which lies on a first edge side of the second LED chip 1 and a bonding area of the conductive pattern 23 provided on the upper surface of the sub-mount substrate 21 in a position lying closer to the second LED chip 1 within the space defined between the first and second LED chips 1 so that an installing direction of the wire 7a from the pad electrode 7a as viewed from thereabove constitutes a direction which is inclined at 15 to 40 degrees towards an orientation which moves away from the first edge 1a of the second LED chip 1 with respect to an orthogonal moving-away direction of the wire 7a relative to the first edge 1a of the second LED chip 1.

The wire 9b is installed between the pad electrode 7b of the two pad electrodes 7a, 7b provided in the two diagonal corners of the upper surface of the second LED chip 1 which lies on a second edge 1b side of the second LED chip 1 and a bonding area of the conductive pattern 23 provided on the upper surface of the sub-mount substrate 21 in a position lying closer to the second LED chip 1 within the space defined between the first and second LED chips 1 so that an installing direction of the wire 9a from the pad electrode 7b as viewed from thereabove constitutes a direction which is inclined at 15 to 40 degrees towards an orientation which approaches the second edge 1b of the second LED chip 1 with respect to an orthogonal moving-away direction of the wire 7b relative to the second edge 1b of the second LED chip 1.

The first LED chips 1 and the second LED chips 1 configure parallel circuits. The four first LED chips 1 are connected in series with each other, and the four second LED chips 1 are connected in series with each other.

Figure 11:
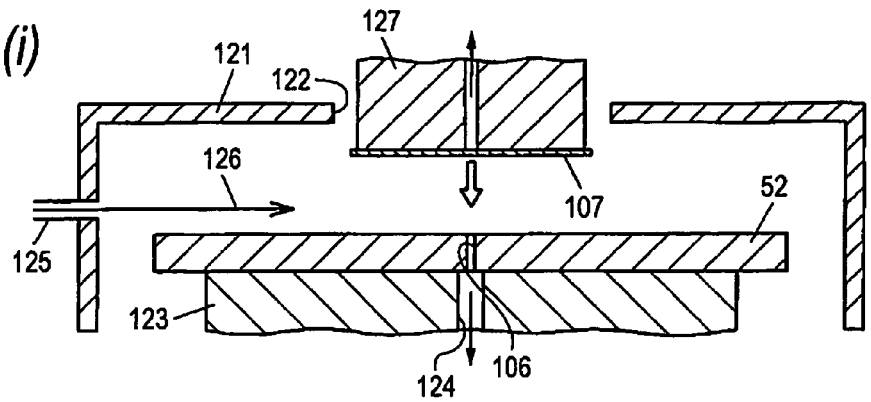
FIGS. 11(i) to (l) show sectional views depicting a former half part of a process of joining a sub-mount substrate to a base substrate with an AuSn sheet-shaped pre-form.
Figure 11:
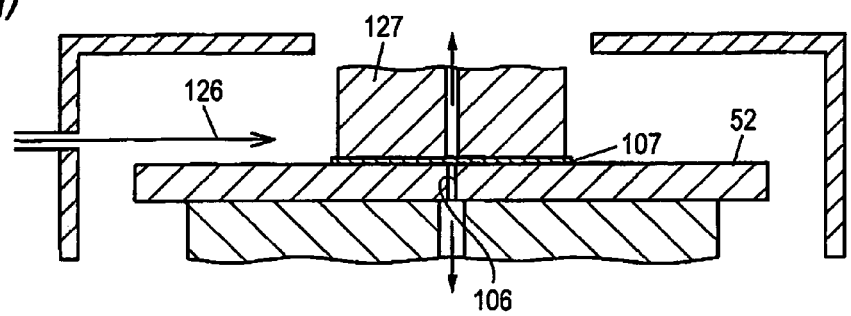
Figure 11:
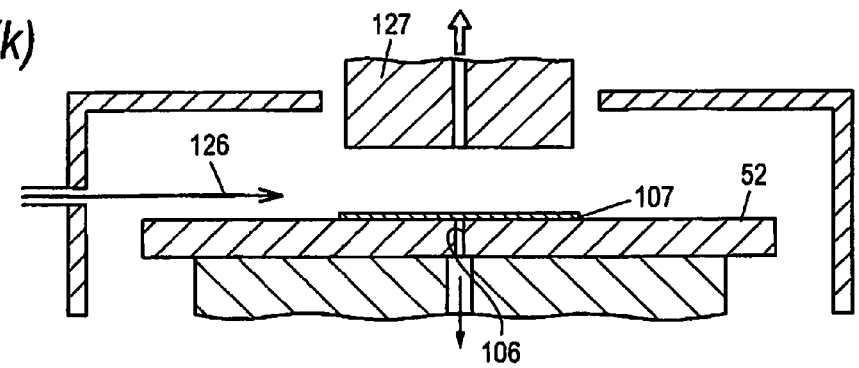
Figure 11:
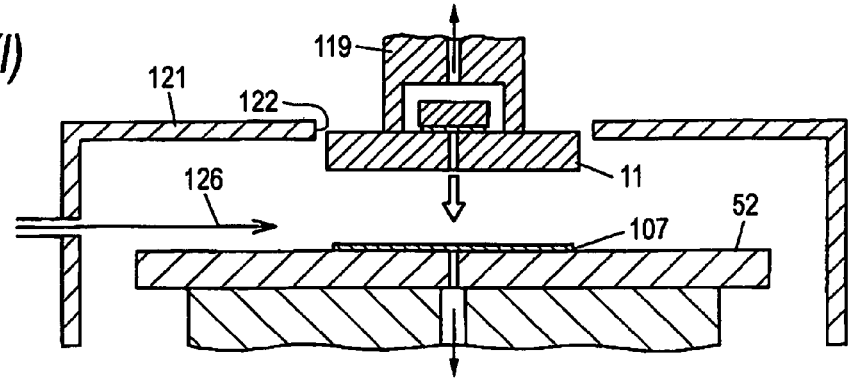

As with Embodiment 1, also in Embodiment 2, since the installing directions of the wires 9a, 9b from the pad electrodes 7a, 7b, respectively, as viewed from thereabove are the directions which are inclined at 15 to 40 degrees with respect to the orthogonal moving-away directions relative to the first edge 1a and the second edge 1b, compared with the conventional example 2 shown in FIG. 11, the widths of the bonding areas of the conductive pattern 23 where the ends of the wires 9a, 9b are bonded can be reduced so as to reduce the size of the sub-mount substrate 21. In addition, the inter-chip-space between the two rows can be reduced.

Embodiment 3

Figure 4:
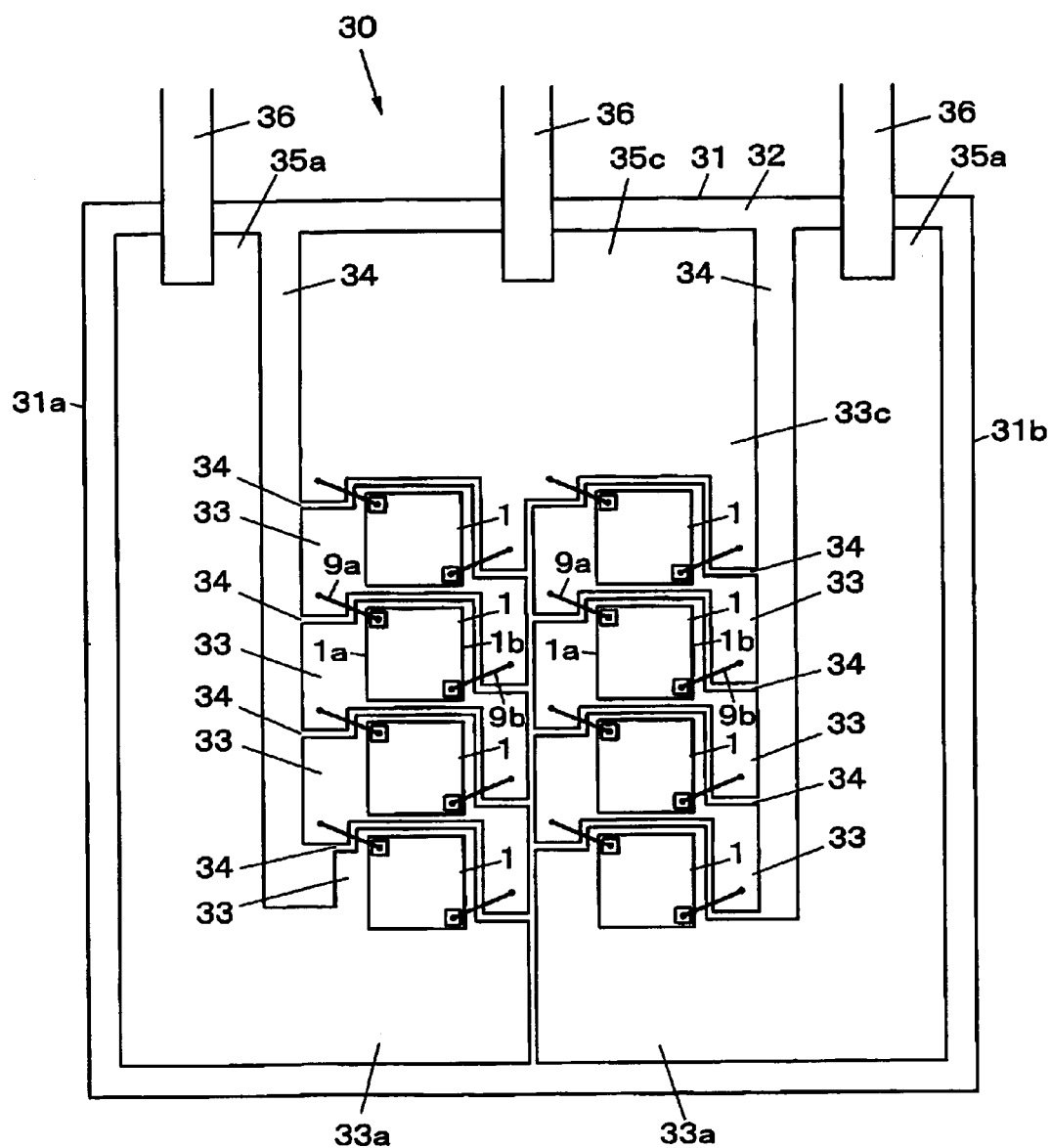
FIG. 4 is a plan view of an LED light emitting apparatus of Embodiment 3.

Embodiment 3 shows in FIG. 4 is an LED light emitting apparatus 30 in which eight LED chips 1 are mounted in two rows so as to form two series circuits on a base substrate 31 which includes receiving terminals for contact with feeding terminals of an illumination appliance.

The LED chips 1 used in Embodiment 3 are the same as the LED chips 1 used in Embodiment 1.

The base substrate 31 is a wiring board or printed circuit board which is made up of an insulating and highly heat conducting ceramic plate 32 (of aluminum nitride, for example) and conductive patterns 33 which are formed into wiring patterns on an upper surface of the ceramic plate 32. As viewed from thereabove, the base substrate 31 has a rectangular shape, and a first edge 31a and a second edge 31b, which face each other laterally in FIG. 4, are parallel. A third edge or an upper edge of the base substrate 31 constitutes a mounting edge where the LED light emitting apparatus 30 is mounted on an illumination appliance.

The conductive patterns 33 include eight conductive patterns and a relatively wide pattern which is arranged above the eight conductive patterns with an insulating area 34 defined therebetween. The eight conductive patterns are arranged into two rows of four conductive patterns which are aligned in parallel laterally, and in each row the four conductive patterns are aligned into a straight line with insulating areas 34 defined therebetween. The LED chips 1 are placed individually on the eight conductive patterns, and lower surfaces of p electrodes 6 are entirely joined to the corresponding conductive patterns 33 electrically and thermally. In FIG. 4, the four LED chips 1 in the left row are referred to as first LED chips 1, and the four LED chips 1 in the right row are referred to as second LED chips. Two wires 9a, 9b are installed to extend, respectively, from two pad electrodes 7a, 7b of an n electrode of each LED chip 1 to the upwardly adjacent conductive pattern 33 in FIG. 4 for bonding. By this configuration, the LED light emitting apparatus 30 is realized in which the eight LED chips 1 are disposed in the two rows and are mounted so as to form two single series circuits. In the conductive patterns 33, the two lowermost conductive patterns 33 each constitute an anode pattern 33a, whereas the uppermost wide conductive pattern constitutes a cathode common pattern 33c.

Embodiment 3 is also similarly characterized by the parallel arrangement of the LED chips 1 on the base substrate 31 and the installing directions of the wires 9a, 9b. Therefore, although the base substrate 31 is large due to the receiving terminals being provided thereon, the size of the base substrate 31 can be reduced to as small a size as possible, and the inter-chip-space defined between the two rows of LED chips can be reduced to as small a space as possible.

Further, Embodiment 3 is characterized in that the common pattern of the conductive patterns 33 can be widened. Namely, the cathode common pattern 33c, which is relatively wider than the other patterns, extends upwards with the width remaining so wide as viewed in FIG. 4, and an extended end portion thereof constitutes a cathode receiving terminal 35c which is positioned in the center of the upper edge or the mounting edge of the base substrate 31. A central feeding terminal 36 provided on an illumination appliance is brought into contact with the cathode receiving terminal 35c. The left-hand side anode pattern 33a extends upwards in a position lying to the left of the left row of LED chips 1 with an insulating area 34 provided therebetween, and an extended end portion thereof constitutes an anode receiving terminal 35a which is positioned at a left-hand side end portion of the upper edge or the mounting edge of the base substrate 31. A left-hand side feeding terminal 36 provided on the illumination appliance is brought into contact with the anode receiving terminal 35a. The right-hand side anode pattern 33a extends upwards in a position lying to the right of the right row of LED chips 1 with an insulating area 34 provided therebetween, and an extended end portion thereof constitutes an anode receiving terminal 35a which is positioned at a right-hand side end portion of the upper edge or the mounting edge of the base substrate 31. A right-hand side feeding terminal 36 provided on the illumination appliance is brought into contact with the anode receiving terminal 35a.

As is described in the conventional example 3, even in the event that the feeding terminals 36 provided on a mounting holder of the illumination appliance are disposed at equal intervals in predetermined positions, with Embodiment 3, since the width of the cathode common pattern 33c can be widened, the electric resistance can be reduced so as to reduce a voltage drop. In addition, the pattern design becomes flexible, and since the insulation areas 34 in the vicinity of the feeding terminals 36 can be widened, the risk of short-circuiting of the circuits is reduced.

Embodiment 4

Figure 5:
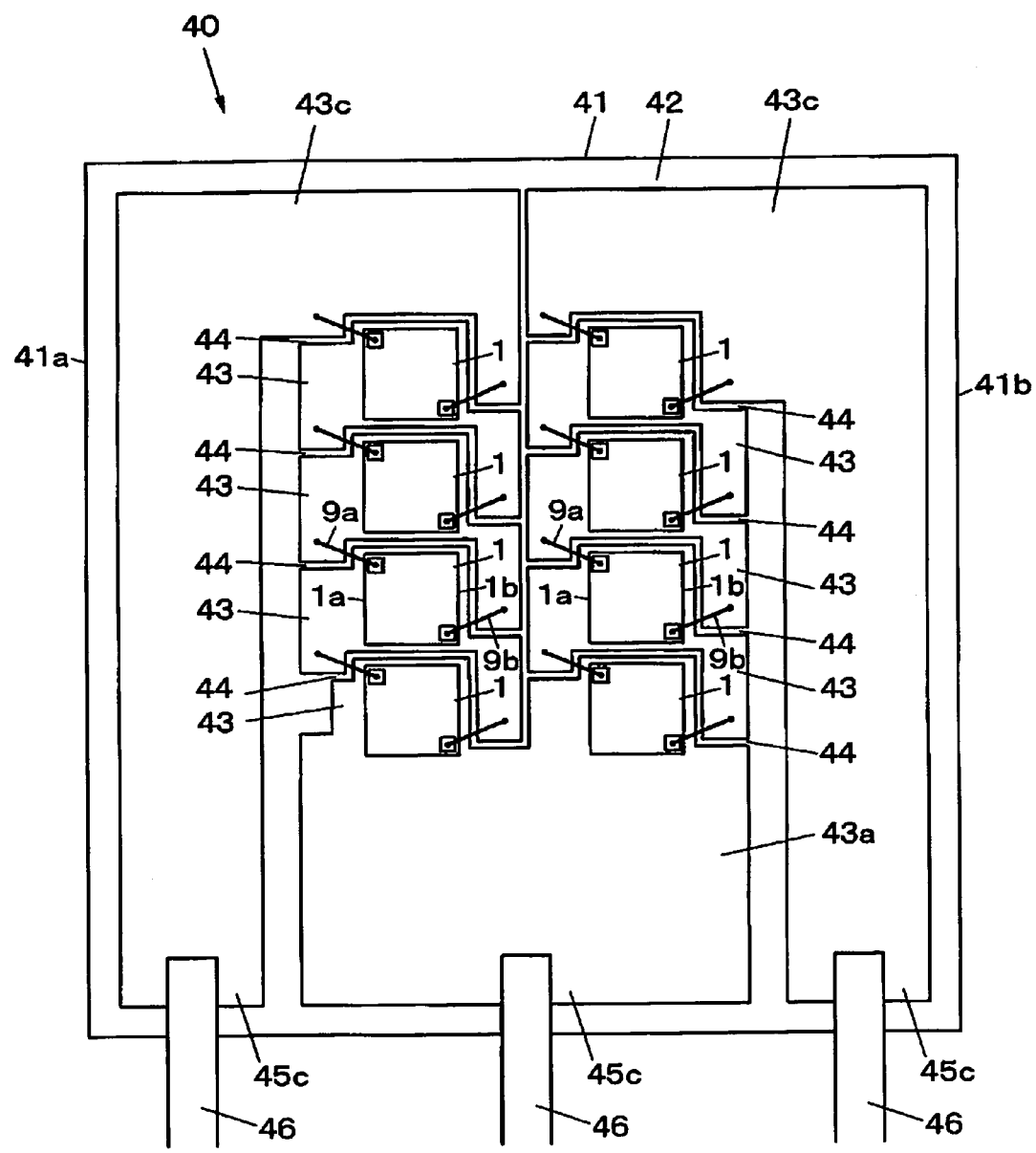
FIG. 5 is a plan view of an LED light emitting apparatus of Embodiment 4.

Similar to Embodiment 3, Embodiment 4 shown in FIG. 5 is an LED light emitting apparatus 40 in which eight LED chips 1 are mounted in two rows to form two series circuits on a base substrate 41 which includes receiving terminals for contact with feeding terminals of an illumination appliance. However, Embodiment 4 differs from Embodiment 3 in that there is provided an anode common pattern.

The LED chips 1 used in Embodiment 4 are the same as the LED chips 1 used in Embodiment 1.

The base substrate 41 is a wiring board or printed circuit board which is made up of an insulating and highly heat conducting ceramic plate 42 (of aluminum nitride, for example) and conductive patterns 43 which are formed into wiring patterns on an upper surface of the ceramic plate 42. As viewed from thereabove, the base substrate 41 has a rectangular shape, and a first edge 41a and a second edge 41b, which face each other laterally in FIG. 5, are parallel. A third edge or a lower edge of the base substrate 41 constitutes a mounting edge where the LED light emitting apparatus 40 is mounted on an illumination appliance. The conductive patterns 43 include eight conductive patterns and a relatively wide pattern which is arranged below the eight conductive patterns with an insulating area 44 defined therebetween. The eight conductive patterns are arranged into two rows of four conductive patterns which are aligned in parallel laterally, and in each row the four conductive patterns are aligned into a straight line with insulating areas 44 defined therebetween. The LED chips 1 are placed individually on the lower six of the eight conductive patterns, and the two LED chips 1 are placed on the wide pattern. Lower surfaces of p electrodes 6 are entirely joined to the corresponding conductive patterns 43 electrically and thermally. Two wires 9a, 9b are installed to extend, respectively, from two pad electrodes 7a, 7b of an n electrode of each LED chip 1 to the upwardly adjacent conductive pattern 43 in FIG. 5 for bonding. By this configuration, the LED light emitting apparatus 40 is realized in which the eight LED chips 1 are disposed in the two rows and are mounted so as to form two single series circuits. In the conductive patterns 43, the lowermost wide pattern in FIG. 5 constitutes an anode common pattern 43a, whereas the uppermost two cathode patterns constitute two cathode patterns 43c.

Embodiment 4 is similar to Embodiment 3 with respect to the parallel arrangement of the LED chips 1 on the base substrate 41 and the installing directions of the wires 9a, 9b. Therefore, although the base substrate 41 is large due to the receiving terminals being provided thereon, the size of the base substrate 41 can be reduced to as small a size as possible, and the inter-chip-space defined between the two rows of LED chips can be reduced to as small a space as possible.

The anode common pattern 43a, which is relatively wider than the other patterns, extends downwards with the width remaining so wide as viewed in FIG. 5, and an extended end portion thereof constitutes an anode receiving terminal 45a which is positioned in the center of the lower edge or the mounting edge of the base substrate 41. A central feeding terminal 46 provided on an illumination appliance is brought into contact with the cathode receiving terminal 45a. The left-hand side cathode pattern 43c extends downwards in a position lying to the left of the left row of LED chips 1 with an insulating area 44 provided therebetween, and an extended end portion thereof constitutes a cathode receiving terminal 45c which is positioned at a left-hand side end portion of the lower edge or the mounting edge of the base substrate 41. A left-hand side feeding terminal 46 provided on the illumination appliance is brought into contact with the cathode receiving terminal 45c. The right-hand side cathode pattern 43c extends downwards in a position lying to the right of the right row of LED chips 1 with an insulating area 44 provided therebetween, and an extended end portion thereof constitutes a cathode receiving terminal 45c which is positioned at a right-hand side end portion of the upper edge or the mounting edge of the base substrate 41. A right-hand side feeding terminal 46 provided on the illumination appliance is brought into contact with the cathode receiving terminal 45c.

Also, with Embodiment 4, since the width of the anode common pattern 43a can be widened due to the same reason as that of Embodiment 3, the electric resistance can be reduced so as to reduce a voltage drop. In addition, the pattern design becomes flexible, and since the insulating areas 44 in the vicinity of the feeding terminals 46 can be widened, the risk of short-circuiting of the circuits is reduced.

Embodiment 5

Figure 6:
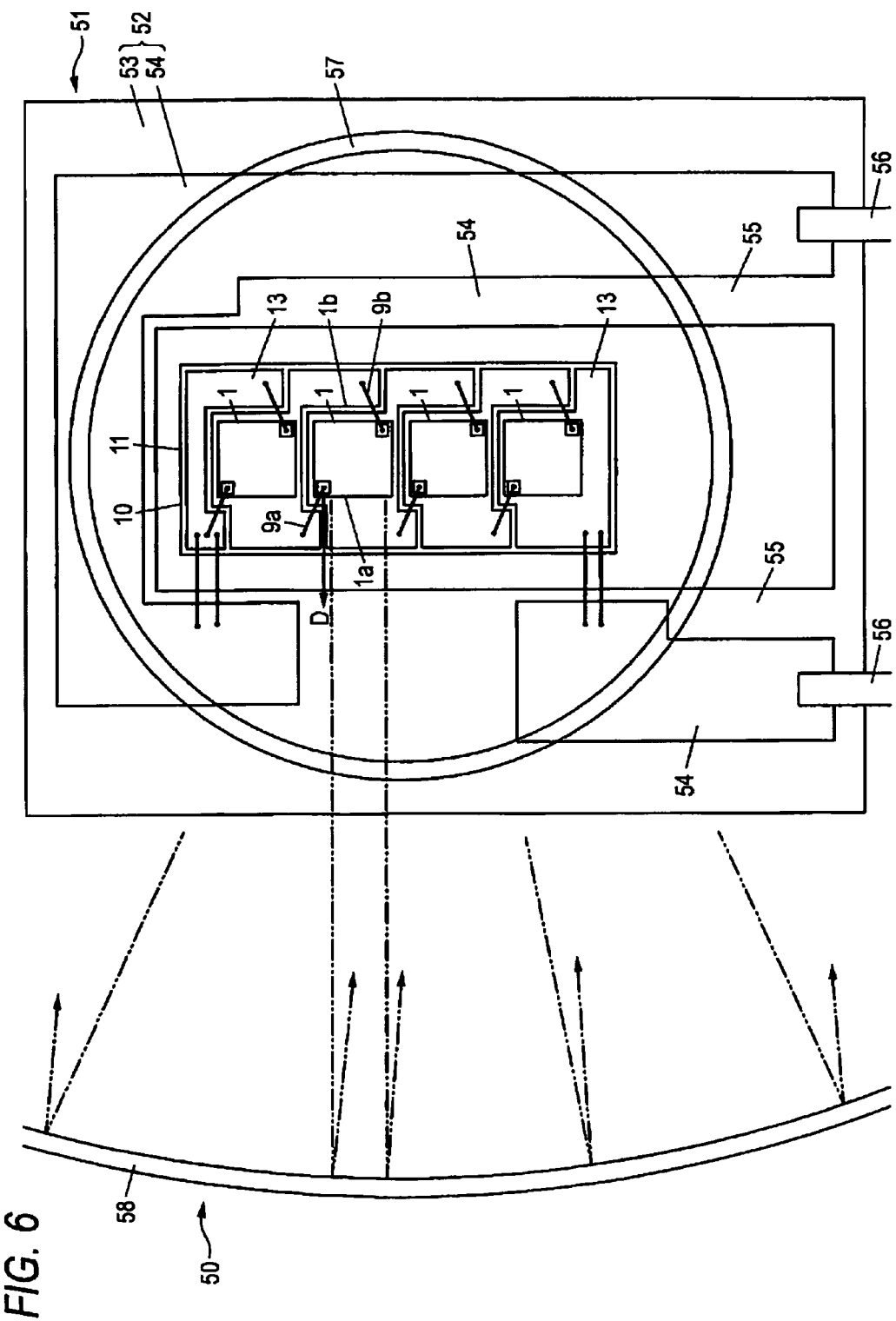
FIG. 6 is a plan view of a main part of a vehicle headlamp (employing the LED light emitting apparatus of Embodiment 1) of Embodiment 5.
Figure 7:
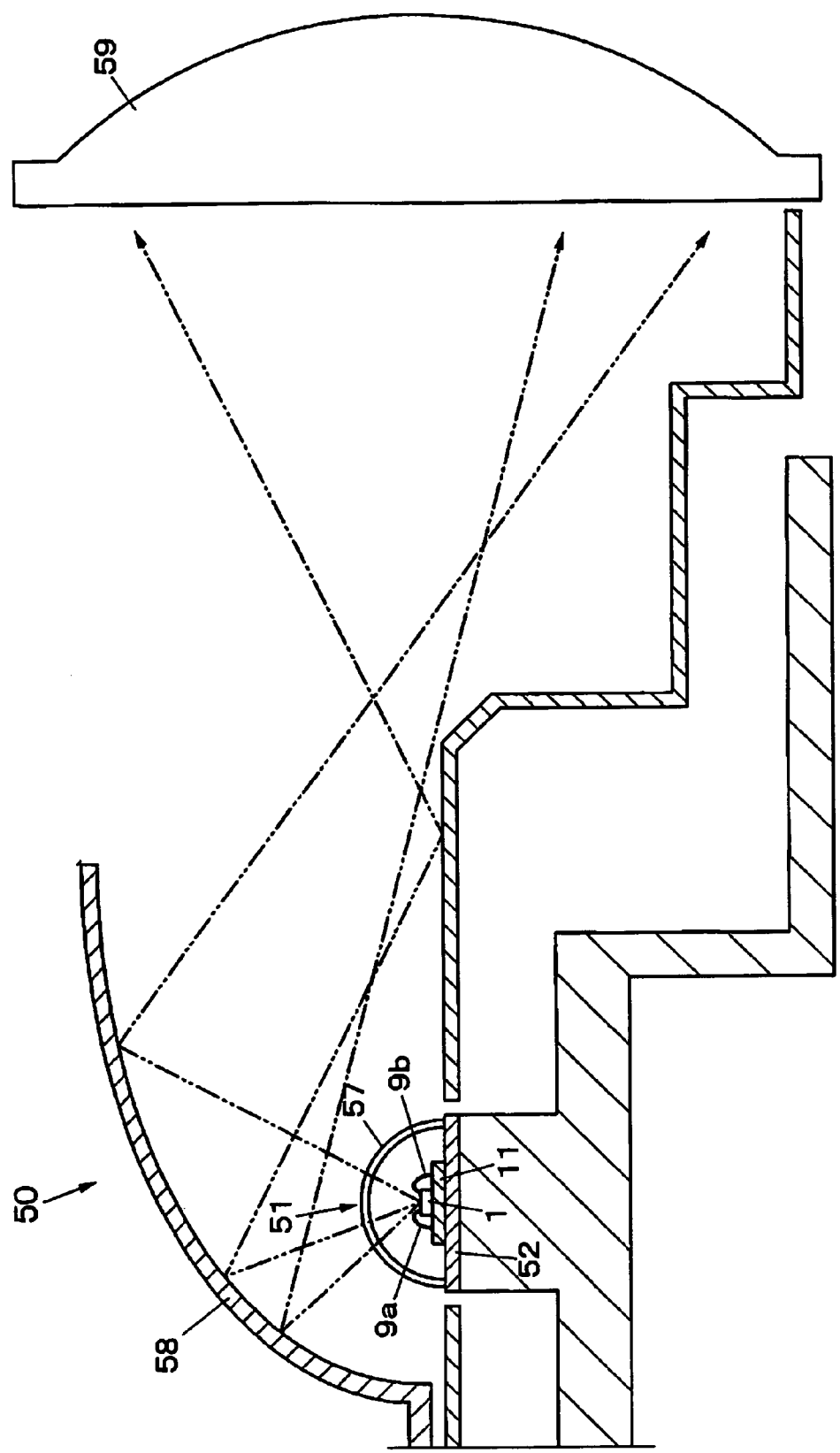
FIG. 7 is a side sectional view of the vehicle headlamp of Embodiment 5.

Embodiment 5 shown in FIGS. 6 and 7 is a vehicle headlamp 50 which is configured by use of the LED light emitting apparatus 10 of Embodiment 1.

The vehicle headlamp 50 includes an LED package 51 which is made up of the LED light emitting apparatus 10 of Embodiment 1 which is mounted on a base substrate 52 with receiving terminals so that its upper surface is oriented upwards and which is placed with its upper side oriented upwards, a substantially semi-paraboloidal reflector 58 which is provided at the rear (to the left in FIGS. 6 and 7) of the LED package 51 so as to extend around the LED chips 1 and a forward illumination lens 59 which is provided in front of the LED package. A central portion of the four LED chips 1 is disposed at or in proximity to a focal point of the reflector 58. Light emitted upwards from light emitting surfaces of the LED chips 1 or to the peripheries thereof is reflected to the front by the reflector 58, so that the light directed to the front is converged to a predetermined range by the forward illumination lens 59.

The base substrate 52 of the LED Chips 1 is a wiring board or a printed circuit board which includes a ceramic plate 53 (of aluminum nitride, for example) and conductive patterns 54 formed into wiring patterns on an upper surface of the ceramic plate 53. The conductive pattern 54 has a central pattern which joins the sub-mount substrate 11 of the LED light emitting apparatus 10, a right-hand side cathode pattern with which the cathode of the LED light emitting apparatus 10 is connected through wire bonding and a left-hand side anode pattern with which the anode of the LED light emitting apparatus 10 is connected with insulating areas 55 interposed therebetween. Feeding terminals 56 are brought into contact with the cathode pattern and the anode pattern. A shell-like cover 57 is provided on the base substrate 52 for encapsulating the LED chips therein. For example, in the event of the color of light emitted from the LED chips 1 being blue, a yellow luminescent material, for example, is contained in a resin applied to surfaces of the LED chips, so that white light is made to be emitted to the outside.

In addition, the LED light emitting apparatus 10 is disposed so that orthogonal moving-away directions D of wires relative to first edges 1*a* of the LED chips 1 constitute directly rearward directions directed from the LED chips 1 towards the reflector 58. As has been described in Embodiment 1 (FIG. 1), the installing direction of the wire 9*a* installed to extend from the pad electrode 7*a* on the first edge 1*a* side of the LED chip 1 is the direction which is inclined at 15 to 40 degrees towards the orientation which moves away from the first edge 1*a* with respect to the orthogonal moving-away direction D relative to the first edge 1*a*. Because of this, the wire 9*a* does not enter the rearward optical path directed from the LED chip 1 to the reflector 58 (in particular, rearwards and obliquely upwards), and therefore, no shadow of the wire is produced. Consequently, a reduction in light quantity can be prevented which would otherwise be the case due to the shadows of the wires. In addition, there is in no case a situation in which the shadows of the wires become visible from an external location, and therefore, the deterioration of an external appearance of the vehicle headlamp 50 can be prevented.

Embodiment 6

Figure 8:
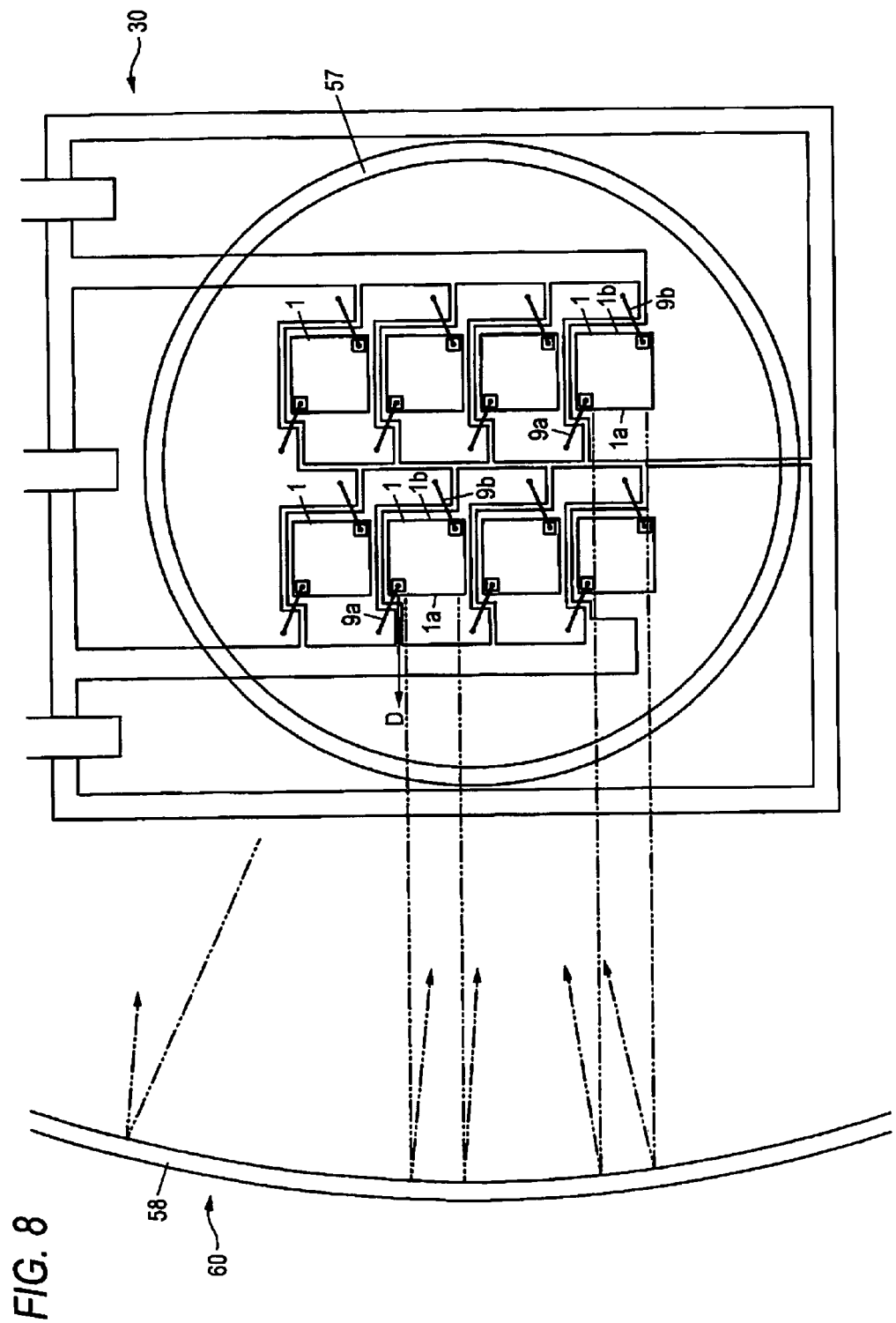
FIG. 8 is a plan view of a main part of a vehicle headlamp (employing the LED light emitting apparatus of Embodiment 3) of Embodiment 6.
Figure 9:
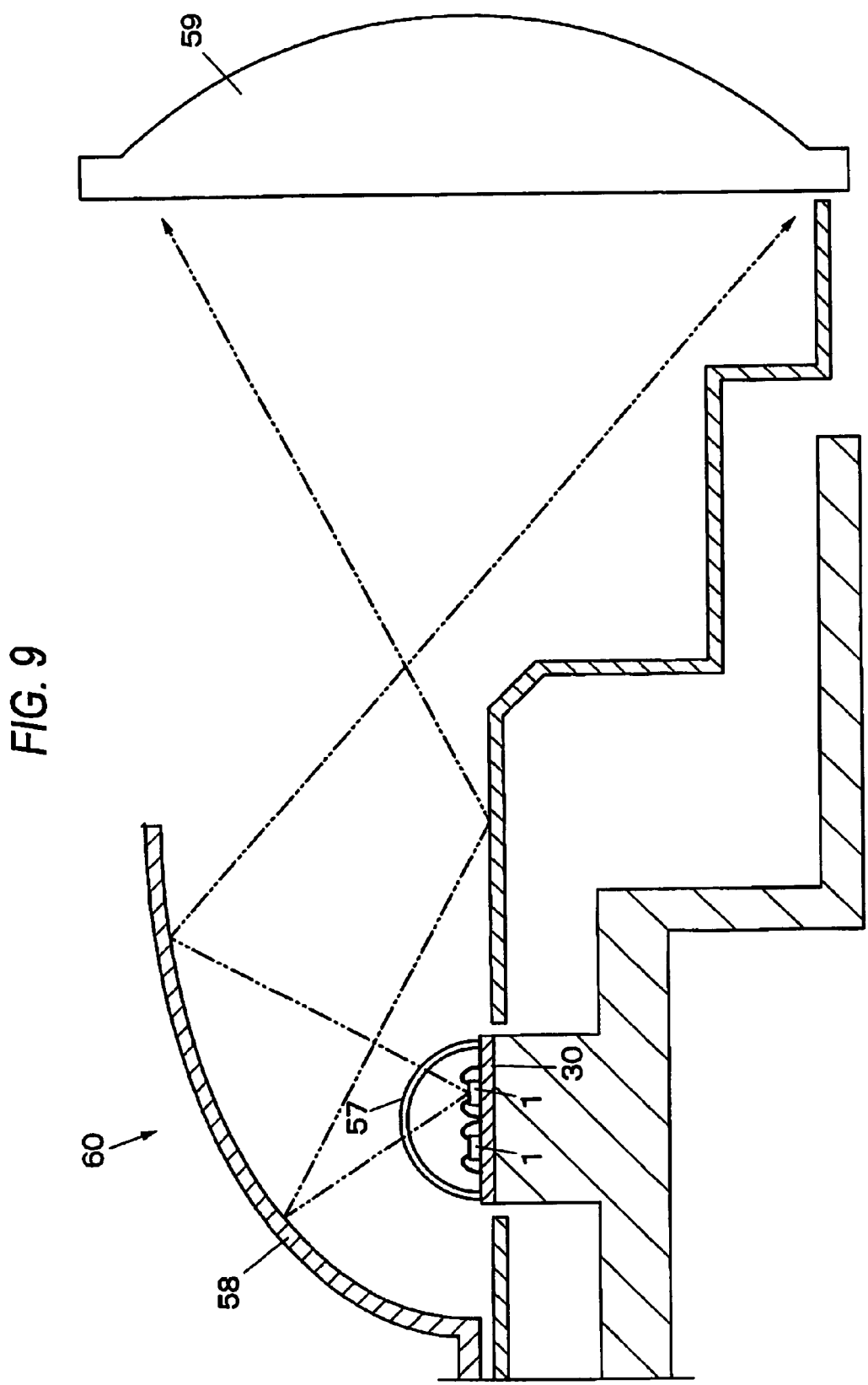
FIG. 9 is a side sectional view of the vehicle headlamp of Embodiment 6.

Embodiment 6 shown in FIGS. 8 and 9 is a vehicle headlamp 60 which employs the LED light emitting apparatus 30 of Embodiment 3 and which is configured in the same way as Embodiment 5.

Also with Embodiment 6, for the same reasons as those of Embodiment 5, a reduction in light quantity due to the shadows of wires can be prevented. In addition, there is in no case a situation in which the shadows of the wires become visible from an external location, and therefore, the deterioration of an external appearance of the vehicle headlamp 60 can be prevented. Further, in Embodiment 6, a left row of four LED chips 1 and a right row of four LED chips 1 are disposed so that their positions in a front-rear direction relative to a focal point of a reflector 58 differ from each other. By adopting this configuration, the first LED chips 1 and the second LED chips can selectively be illuminated, whereby light is reflected in different ways by the reflector 58 so as to change illumination ranges of the headlamp 60.

Hereinafter, the way to joint the LED chip to the sub-mount substrate when making up the LED light emitting apparatus 10 shown in the embodiment 1, and the way to joint the sub-mount substrate to the base substrate when making up the LED package 51 shown in the embodiment 5 will be described.

FIGS. 10(*a*) to (*h*) are sectional views depicting a process of joining a LED chip to a sub-mount substrate and show a process of joining the LED chip 1 as a member to be joined to the sub-mount substrate 11 made of aluminum nitride as a mount substrate by an AuSn sheet-shaped pre-form 104 sandwiched therebetween. A surface size of the sub-mount substrate 11 is larger than a surface size of the LED chip 1. The LED chip 1 is joined to a substrate position which allows an upper surface of the sub-mount substrate 11 to appear around the LED chip 1. Circled reference numeral 1 in FIG. 13(*a*) depicts this process conceptually. A suction hole 103 whose opening diameter is 0.25 mm, for example, is formed in the sub-mount substrate 11 in advance. For example, an AuSn eutectic sheet-shaped pre-form is used as the AuSn sheet-shaped pre-form 104. The AuSn eutectic sheet-shaped pre-form has four sides which are positioned 0.2 mm further inwards than four edges of a joining surface (a quadrangular lower surface) of the LED chip 1. The thickness of the AnSn eutectic sheet-shaped pre-form is 20 µm.

Figure 13:
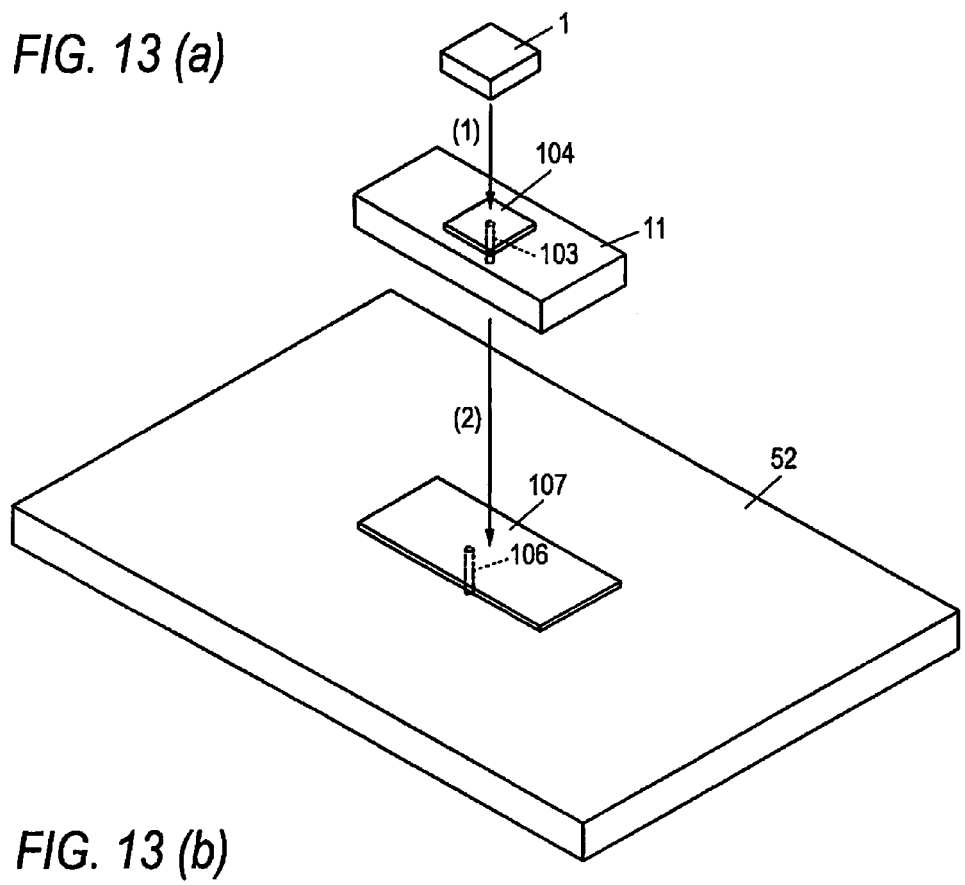
FIG. 13(a) is an exploded perspective view depicting conceptually a fabricating order of an LED package of the embodiment.
FIG. 13(b) is a perspective view of the fabricated LED package.
Figure 13:
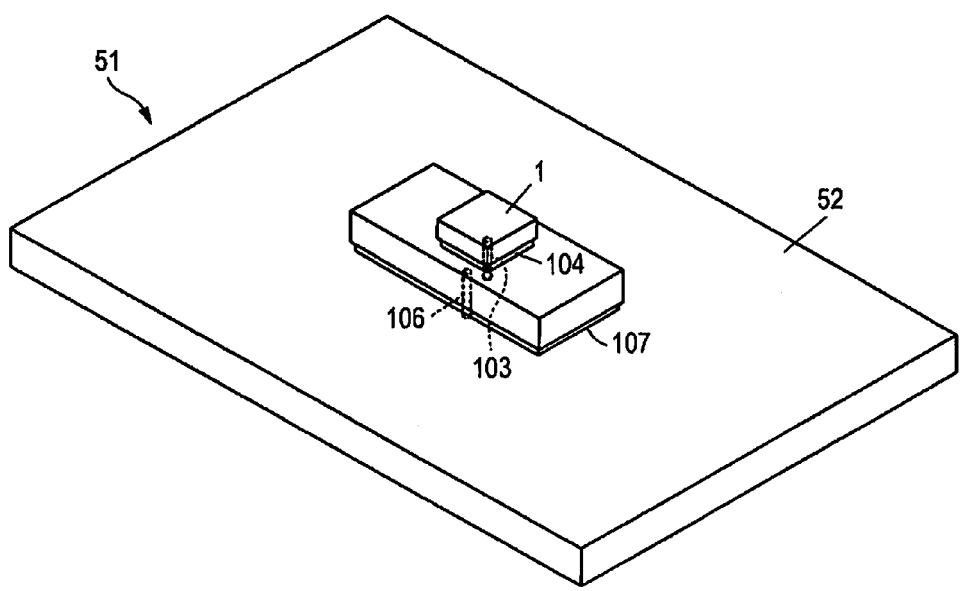

Herein, the number of the LED chip 1 on the sub-mount substrate 11 is plural number as shown in the embodiment 1. However, the number of the LED chip 1 can be single number as shown in FIG. 13(*a*), (*b*) and FIG. 14(*b*).

Also, the sub-mount substrate 11 has the suction hole 103 in a region in which the LED chip is to be mounted. The LED chip 1 can be joined to the sub-mount substrate by the AuSn sheet-shaped pre-form 104 that is provided so as to cover the suction hole 103.

Hereinafter, the detail explanation of the process will be described.

Firstly, as is shown in FIG. 10(*a*), the sub-mount substrate 11 is placed on a suction table 113 including a through hole 114 in an interior of a chamber 111 having an upper opening 112. The through hole 114 and the suction hole 103 communicate with each other. Air staying above the sub-mount substrate 11 is started to be drawn in through the through hole 114 and the suction hole 103 by a vacuum drawing device (whose illustration is omitted) connected to a rear side of the suction table 113. A nitrogen gas 116 as a non-oxidizing gas is started to be sprayed to a front surface side of the sub-mount substrate 11 from a gas supply tube 115.

Figure 14:
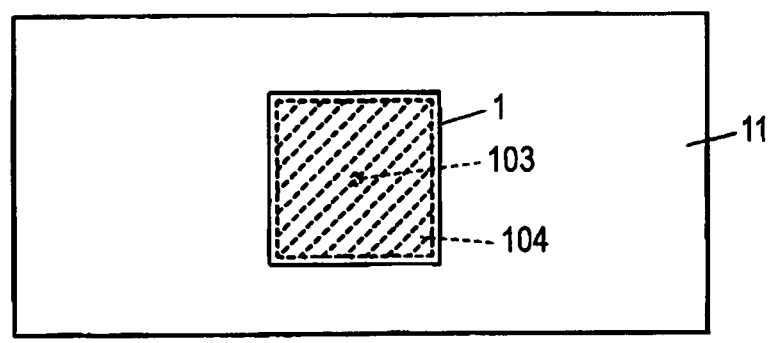
FIG. 14(a) is a plan view depicting an example according to the embodiment which is free from registration error and void.
FIG. 14(b) is a plan view depicting a modified example of the embodiment.
Figure 14:
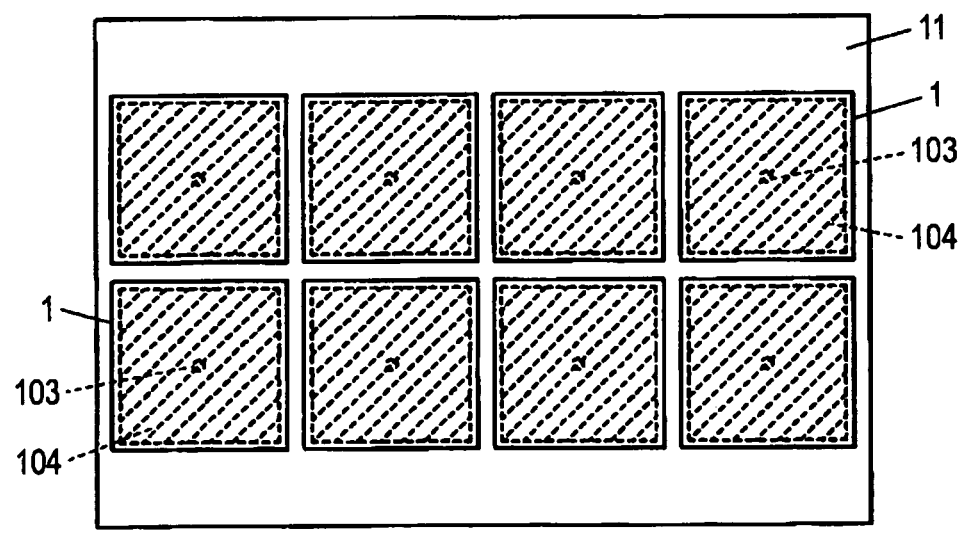
Figure 15:
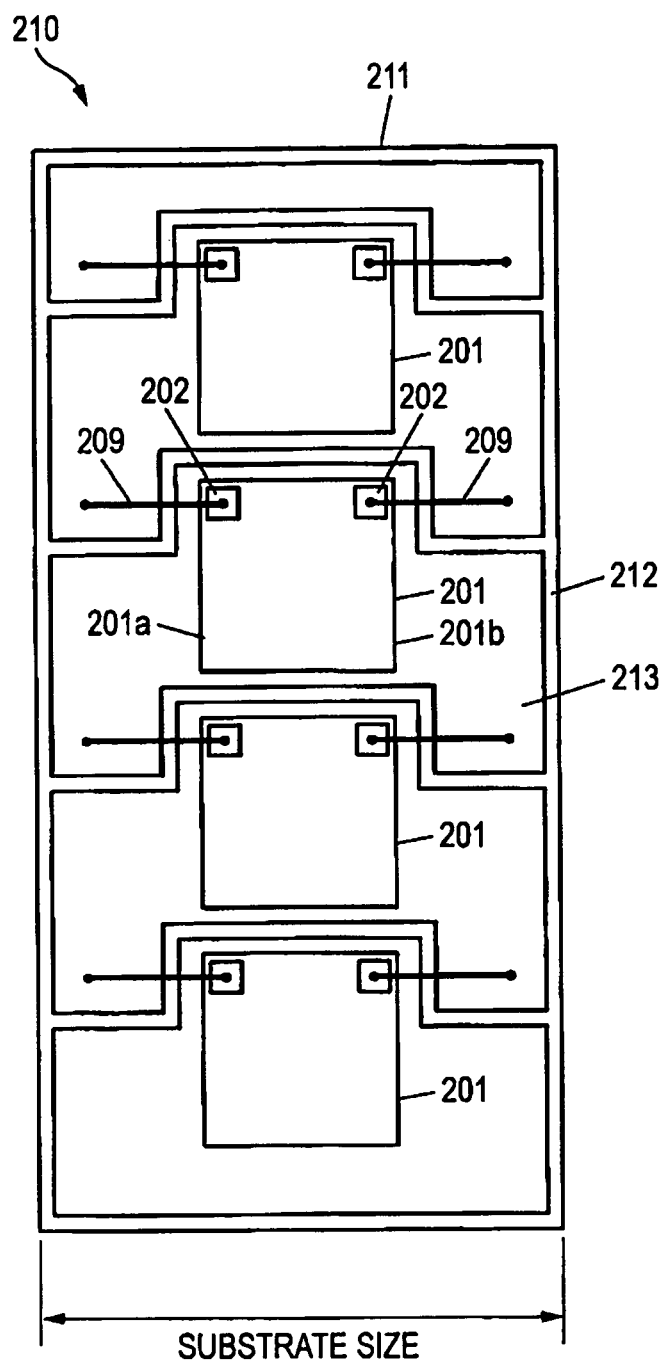
FIG. 15 is a plan view of an LED light emitting apparatus of Conventional Example 1.
Figure 16:
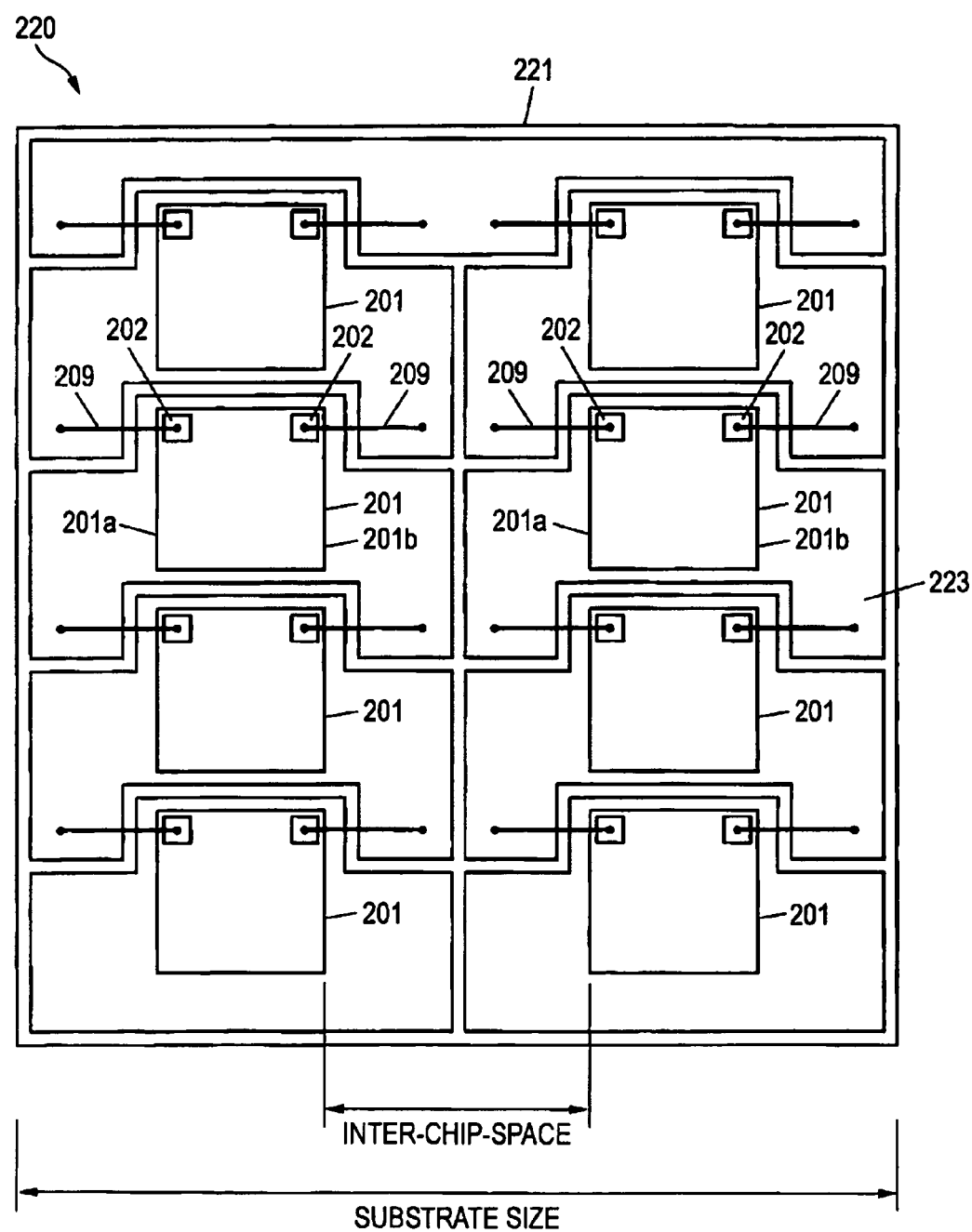
FIG. 16 is a plan view of an LED light emitting apparatus of Conventional Example 2.
Figure 17:
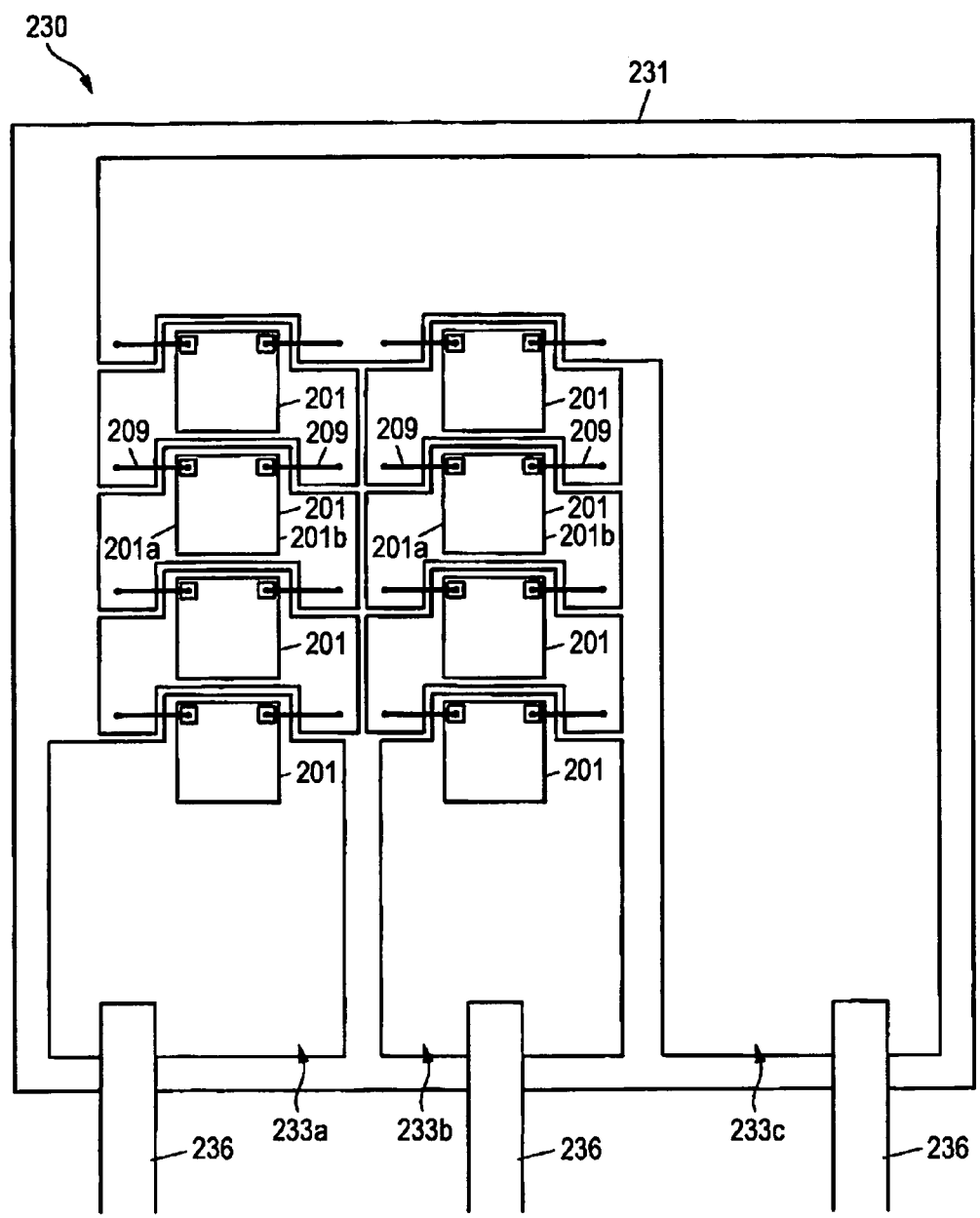
FIG. 17 is a plan view of an LED light emitting apparatus of Conventional Example 3.
Figure 18:
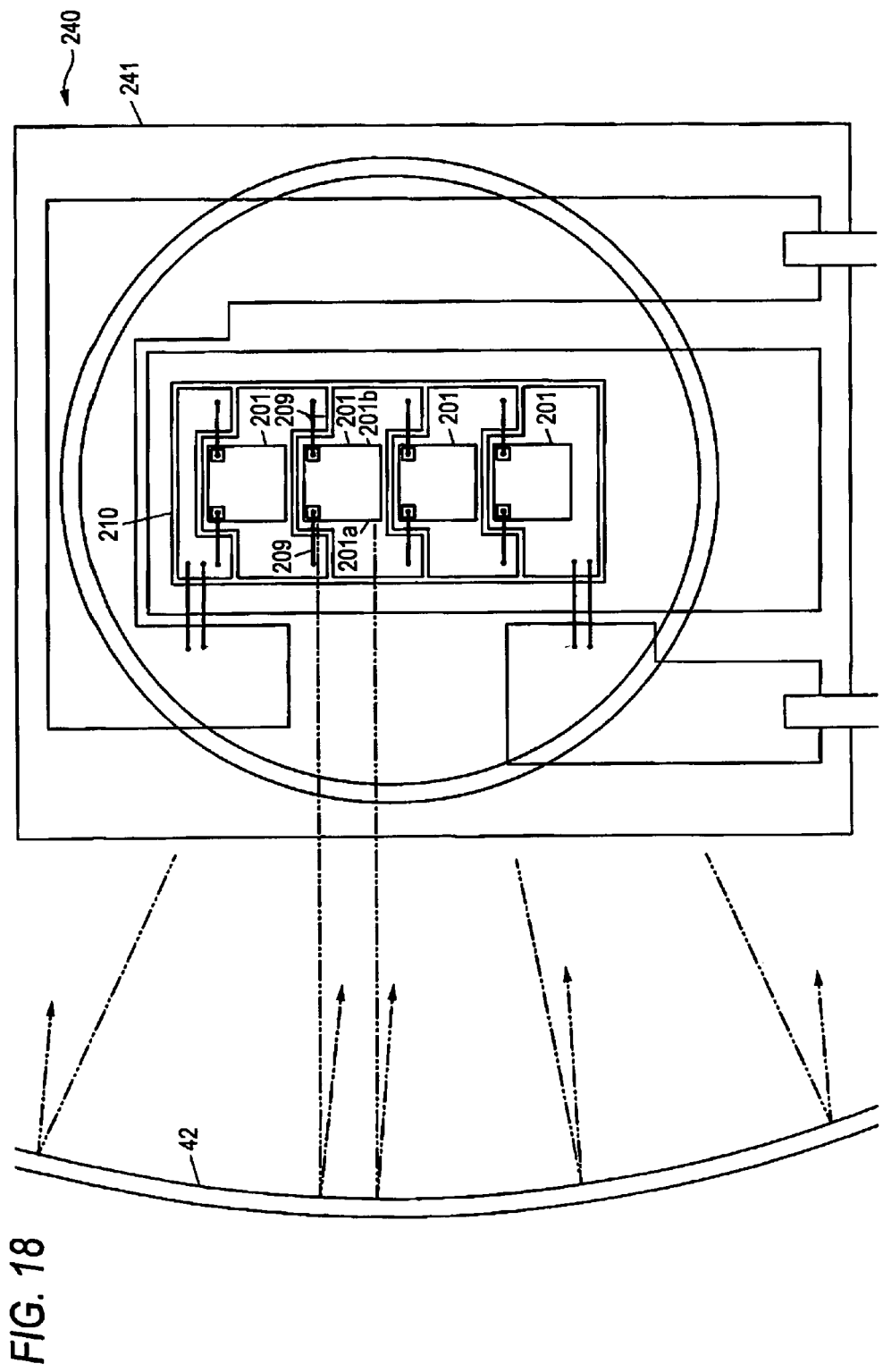
FIG. 18 is a plan view of a main part of a vehicle headlamp (employing the LED light emitting apparatus of Conventional Example 1) of Conventional Example 4.

With this air drawing and nitrogen gas 116 spraying operations kept performed, the AuSn sheet-shaped pre-form 104 is inserted into the interior of the chamber 111 from the upper opening 112 by being attracted to be gripped on by a known vacuum attracting chuck 117. Then, as is shown in FIG. 10(*b*), the AuSn sheet-shaped pre-form 104 is positioned on a front surface of the sub-mount substrate 102 so as to cover an opening of the suction hole 103. Since the AuSn sheet-shaped pre-form 104 is attracted to be attached to the front surface of the sub-mount substrate 102 by being sucked from the suction hole 103, as is shown in FIG. 10(*c*), the attraction by the vacuum attracting chuck 117 is stopped, and the vacuum attracting chuck 117 is withdrawn from the chamber 111. Since the AuSn sheet-shaped pre-form 104 is kept attracted to the front surface of the sub-mount substrate 11 even after the vacuum attracting chuck 117 has been withdrawn, there is caused no such situation that the AuSn sheet-shaped pre-form 104 is separated or displaced laterally from the proper position by the nitrogen gas 116, whereby the position accuracy is maintained as is shown in FIG. 14(*a*).

As is shown in FIG. 10(*d*), the LED chip 101 is inserted into the interior of the chamber 111 from the upper opening 112 by being attracted by a known vacuum attracting chuck 118. Then, as is shown in FIG. 10(*e*), the LED chip 1 is placed on the AuSn sheet-shaped pre-form 104, and thereafter, the attraction of the LED chip 1 by the vacuum attracting chuck 118 is stopped. Since the LED chip 1 is kept pressed on by the vacuum attracting chuck 118, there is no concern that the AuSn sheet-shaped pre-form 104 is caused to move. Therefore, the attraction of the AuSn sheet-shaped pre-form 104 from the suction hole 103 is also stopped.

With the nitrogen gas 116 kept sprayed, the attracting table 113 and the vacuum attracting chuck 118 are heated by heaters (whose illustration is omitted) provided therein, so that the AuSn sheet-shaped pre-form 104 is heated from both the sub-mount substrate 11 and the LED chip 1 to be melted, starting to join the sub-mount substrate 11 and the LED chip together. Thick arrows in FIG. 10(*e*) indicate how heat is conducted. Even in the event that ambient air and gases produced through vaporization of impurities are taken in under the AuSn sheet-shaped pre-form 104 (or between the AuSn sheet-shaped pre-form 104 and the sub-mount substrate 11) at the time of joining the sub-mount substrate 102 and the LED chip 101, the air and gases are sucked out from the suction hole 103 for removal. Therefore, as is shown in FIG. 14(a), joining free from void is enabled. Because of this, there is caused no such situation that the joining area is reduced, and consequently, neither insufficient joining strength nor insufficient heat dissipation occurs.

By stopping the heating of the sub-mount substrate 11 and the LED chip 1 to allow the melted AuSn sheet-shaped pre-form 104 to solidify, the sub-mount substrate 11 and the Led chip 1 are joined together, whereafter, as is shown in FIG. 10(f), spraying the nitrogen gas 116 is stopped, and the vacuum attracting chuck 118 is withdrawn.

Following the withdrawal of the vacuum attracting chuck 118, as is shown in FIG. 10(g), a vacuum attracting chuck 119 is inserted into the interior of the chamber 111 from the upper opening 112. As is shown in FIG. 10(h), the sub-mount substrate 11 (to which the LED chip 1 is joined) is attracted by the vacuum attracting chuck 119, and the process then proceeds to FIGS. 11(i) to (l). A recess portion 120, which is larger than the LED chip 1, is provided in the vacuum attracting chuck 119 so as to accommodate therein the LED chip 1 without contact with the vacuum attracting chuck 119 (or so as to allow the LED chip 1 to escape from contact with the vacuum attracting chuck 119) when the vacuum attracting chuck 119 attracts the sub-mount substrate 11. However, there may be a form in which no recess portion 120 is provided.

FIGS. 11(i) to (l) and Figs. (m) to (o) show sectional views depicting a process of joining a sub-mount substrate to a base substrate and depict a process of joining the sub-mount substrate 11 (to which the LED chip 1 is joined) to a base substrate 52 made of aluminum nitride by an AuSn sheet-shaped pre-form 107 which is sandwiched therebetween. A surface size of the base substrate 52 is larger than the surface size of the sub-mount substrate 11. The sub-mount substrate 11 is joined to a substrate position which allows an upper surface of the base substrate 52 to appear around the sub-mount substrate 11. Circled reference numeral 2 in FIG. 13(a) depicts this process conceptually. A suction hole 106 whose opening diameter is 0.25 mm, for example, is formed in the base substrate 52 in advance. For example, an AuSn eutectic sheet-shaped pre-form is used as the AuSn sheet-shaped pre-form 107. The AuSn eutectic sheet-shaped pre-form has four sides which are positioned 0.2 mm further inwards than four edges of a joining surface (a quadrangular lower surface) of the sub-mount substrate 11. The thickness of the AnSn eutectic sheet-shaped pre-form is 20 µm.

Herein, the base substrate 52 has the suction hole 106 in a region in which the sub-mount substrate 11 is to be mounted. The sub-mount substrate 11 can be joined to the base substrate 52 by the AuSn sheet-shaped pre-form 107 that is provided so as to cover the suction hole 106.

Hereinafter, the detail explanation of the process will be described.

Firstly, as is shown in FIG. 11(i), the base substrate 52 is placed on a suction table 123 including a through hole 124 in an interior of a chamber 121 having an upper opening 122. The through hole 124 and the suction hole 106 communicate with each other. Air staying above the base substrate 52 is started to be drawn in through the through hole 124 and the suction hole 106 by a vacuum drawing device (whose illustration is omitted) connected to a rear side of the suction table 123. A nitrogen gas 126 as a non-oxidizing gas is started to be sprayed to a front surface side of the sub-mount substrate 11 from a gas supply tube 125.

With this air drawing and nitrogen gas 126 spraying operations kept performed, the AuSn sheet-shaped pre-form 107 is inserted into the interior of the chamber 121 from the upper opening 122 by being attracted to be gripped on by a known vacuum attracting chuck 127. Then, as is shown in FIG. 11(j), the AuSn sheet-shaped pre-form 107 is positioned on a front surface of the base substrate 52 so as to cover an opening of the suction hole 106. Since the AuSn sheet-shaped pre-form 107 is attracted to be attached to the front surface of the base substrate 52 by being sucked from the suction hole 106, as is shown in FIG. 11(k), the attraction by the vacuum attracting chuck 127 is stopped, and the vacuum attracting chuck 127 is withdrawn from the chamber 121. Since the AuSn sheet-shaped pre-form 107 is kept attracted to the front surface of the base substrate 52 even after the vacuum attracting chuck 127 has been withdrawn, there is caused no such situation that the AuSn sheet-shaped pre-form 107 is separated or displaced laterally from the proper position by the nitrogen gas 126, whereby the position accuracy is maintained.

Figure 12:
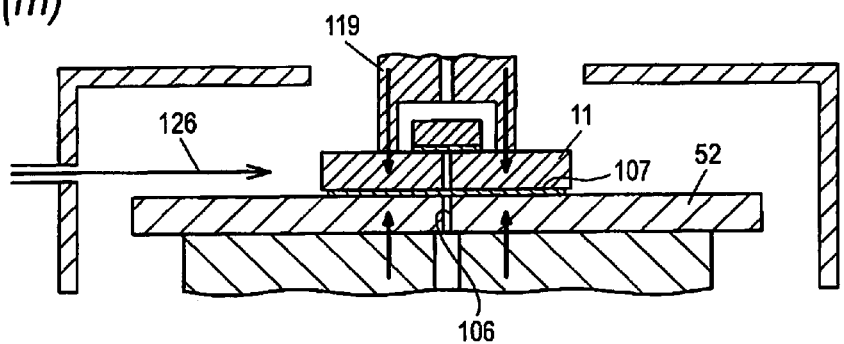
FIGS. 12(m) to (o) show sectional views depicting a latter half part of the process of joining the sub-mount substrate to the base substrate with the AuSn sheet-shaped pre-form.
Figure 12:
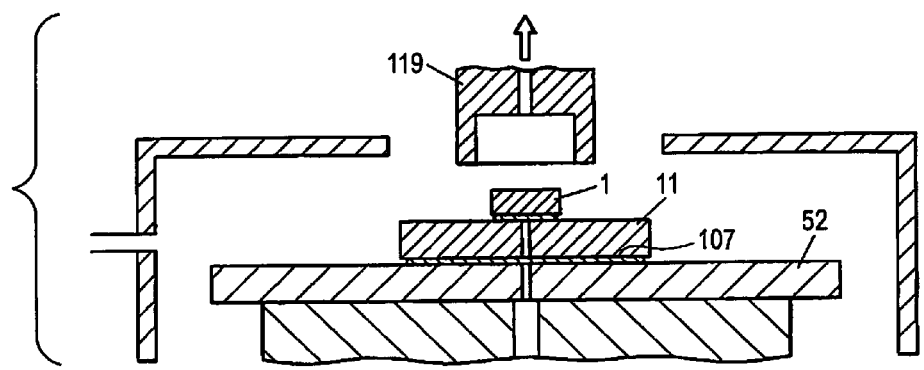
Figure 12:
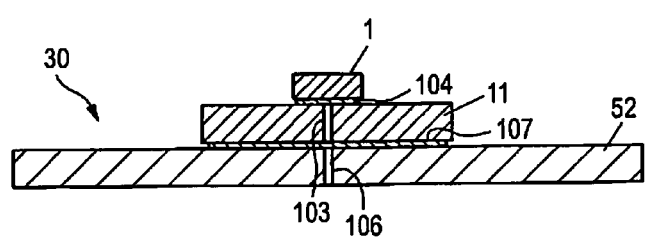

As is shown in FIG. 11(l), the sub-mount substrate 11 (to which the LED chip 1 is joined) which was attracted by the vacuum attracting chuck 119 in FIG. 10(h) is inserted into the interior of the chamber 121 from the upper opening 122. Then, as is shown in FIG. 12(m), the sub-mount substrate 11 is placed on the AuSn sheet-shaped pre-form 107, and the attraction of the sub-mount substrate 11 is stopped. Since the sub-mount substrate 11 is kept pressed on by the vacuum attracting chuck 119, there is no concern that the AuSn sheet-shaped pre-form 107 is caused to move. Therefore, the attraction of the AuSn sheet-shaped pre-form 107 from the suction hole 106 is also stopped.

With the nitrogen gas 126 kept sprayed, the attracting table 123 and the vacuum attracting chuck 119 are heated by heaters (whose illustration is omitted) provided therein, so that the AuSn sheet-shaped pre-form 107 is heated from both the base substrate 52 and the sub-mount substrate 11 to be melted, starting to join the base substrate 52 and the sub-mount substrate 11 together. Thick arrows in FIG. 12(m) indicate how heat is conducted. Even in the event that ambient air and gases produced through vaporization of impurities are taken in under the AuSn sheet-shaped pre-form 107 (or between the AuSn sheet-shaped pre-form 107 and the base substrate 105) at the time of joining the base substrate 52 and the sub-mount substrate 11, the air and gases are sucked out from the suction hole 6 for removal. Therefore, as in the case shown in FIG. 14(a), joining free from void is enabled. Because of this, there is caused no such situation that the joining area is reduced, and consequently, neither insufficient joining strength nor insufficient heat dissipation occurs.

By stopping the heating of the base substrate 5 and the sub-mount substrate 11 to allow the melted AuSn sheet-shaped pre-form 107 to solidify, the base substrate 52 and the sub-mount substrate 11 are joined together, then, as is shown in FIG. 12(n), spraying the nitrogen gas 126 is stopped, and the vacuum attracting chuck 119 is withdrawn. Thus, after the series of joining operations described heretofore, as is shown in FIGS. 12(o) and 13(b), the LED package 51 is fabricated in which the LED chip 1 is joined to the sub-mount substrate 11 and the sub-mount substrate 11 is joined to the base substrate 52.

As is shown in the embodiment 1 and FIG. 14(b), in a case that a plurality of LED chips 1 are mounted on the one sub-mount substrate 11 such that first edges of the plurality of LED chips 1 are aligned with each other in a straight line, and the plurality of LED chips 1 are joined to one sub-mount substrate 11 by corresponding AuSn sheet-shaped pre-forms 104, a plurality of suction holes are respectively formed in a region of the sub-mount substrate 11 on which the plurality of LED chips 1 are mounted so as to individually attract the AuSn sheet-shaped pre-forms 104.

Hereinafter, examples and preferred forms of the respective elements of the joining method described above will be described.

1. Substrate Mounted Module

Although not limited to those having specific functions, as an example of a substrate mounted module, there can be raised an LED package, a laser diode and a module.

In the case of an LED package, the following forms can be raised as an example: (a) a form in which a member to be joined is an LED chip, and a mount substrate is a sub-mount substrate; (b) a form in which a member to be joined is a sub-mount substrate and a sub-mount substrate is a base substrate; (c) a form in which the sub-mount substrate to which the member to be joined is joined in (a) above is joined to the base substrate in (b); and (d) a form in which a member to be joined is an LED chip and a mount substrate is a base substrate.

In addition, although the joining method of the member to be joined and the sub-mount substrate of the forms (a) and (c) in the embodiments 1 and 2 are explained in above explanation, the joining method can be applied to other embodiments or the forms (b) and (d).

As in the form described under (b) above, where the member to be joined is the sub-mount substrate to which the LED chip is joined, the operation of placing the sub-mount substrate as the member to be joined on the AuSu sheet-shaped preform in the first step and the second step are preferably performed by gripping the sub-mount substrate with a chuck including a recess portion in which the LED chip can be accommodated without being touched. As this chuck, although not limited thereto specifically, there can be raised a vacuum attracting chuck as an example.

2. AuSu Sheet-Shaped Preform

Although there is imposed no specific limitation on the planar dimensions and configuration of the AuSu sheet-shaped preform, planar dimensions and configuration are preferable which can match the dimensions and configuration of a joining surface of the member to be joined. Planar dimensions and configuration are more preferable in which an edge of the AuSu sheet-shaped pre-form lies 0.1 to 0.6 mm further inwards of an edge of the joining surface of the member to be joined.

Although there is imposed no specific limitation on the thickness of the AuSu sheet-shaped pre-form, in consideration of joining force, heat conduction and costs, a thickness of 15 to 35 µm is preferable and a thickness of 20 to 30 µm is more preferable.

3. Non-Oxidizing Gas

Although there is imposed no specific limitation on kinds of non-oxidizing gases, there can be raised as an example rare gases such as argon, xenon and helium, hydrogen gases and nitrogen gases. Although they are expensive, the rare gases are highly effective. The nitrogen gases are preferable since they are inexpensive and effective sufficiently.

Although there is imposed no specific limitation on the spraying amount of non-oxidizing gas, in the case of the member to be joined being the LED chip and the mount substrate being the sub-mount substrate, a spraying amount of 3 to 7 litters/min is preferable.

4. Suction Hole

Although there is imposed no specific limitation on the aperture diameter of the suction hole, an aperture diameter of 0.15 µm to 0.4 mm is preferable. This is because in the event that the aperture diameter is smaller than 0.15 µm, the suction force tends to be decreased, whereas in the event that the aperture diameter is larger than 0.4 mm, there is a tendency that the AuSu sheet-shaped pre-form is deformed so as to enter the suction hole.

There is imposed no specific limitation on the number of suction holes. Therefore, for example, there may be provided one suction hole adapted to suck the AuSu sheet-shaped pre-form at a central portion thereof. Alternatively, there may be provided a plurality of suction holes which are adapted to such the AuSu sheet-shaped at a plurality of portions which are dispersed thereover.

The invention is not limited to the embodiments described heretofore and hence can be carried out in various ways by being modified as required without departing from the spirit and scope of the invention.

What is claimed is:

1. An LED light emitting apparatus, comprising:
a substrate having a first edge and a second edge that is faced to the first edge and parallel to the first edge, and a conductive pattern provided on an upper surface of the substrate, the conductive pattern having a first bonding area which lies on a first edge side of the substrate and a second bonding area which lies on a second edge side of the substrate;
an LED chip having a first edge and a second edge that is faced to the first edge and parallel to the first edge, and having a first pad electrode which lies on a first edge side of the LED chip, and a second pad electrode which lies on a second edge side of the LED chip, the first and second pad electrodes being provided on two diagonal corners of an upper surface of the LED chip, the LED chip being mounted on the substrate so that the first edge of the LED chip and the first edge of the substrate become parallel to each other at intervals and the second edge of the LED chip and the second edge of the substrate become parallel to each other at intervals;
a first wire installed between the first pad electrode and the first bonding area; and
a second wire installed between the second electrode and the second bonding area;
wherein an installing direction of the first wire from the first pad electrode, as viewed from thereabove, is inclined at 15 to 40 degrees relative to a first orthogonal moving-away direction extending toward the first edge of the substrate from the first edge of the LED chip that is orthogonal to the first edge of the LED chip; and
wherein an installing direction of the second wire from the second pad electrode, as viewed from thereabove, is inclined at 15 to 40 degrees relative to a second orthogonal moving-away direction extending toward the second edge of the substrate from the second edge of the LED chip that is orthogonal to the second edge of the LED chip.

2. The LED light emitting apparatus as set forth in claim 1, wherein a plurality of the LED chips are mounted on the substrate so that first edges of the plurality of LED chips are aligned with each other in a straight line so that the plurality of LED chips configure a series circuit.

3. The LED light emitting apparatus as set forth in claim 1, wherein a plurality of the LED chips that are comprised of a first LED chip and a second LED chip are mounted on the substrate in rows so that as that the plurality of LED chips configure parallel circuits and a second edge of the first LED chip and a first edge of the second LED chip are parallel to each other at intervals.

4. The LED light emitting apparatus as set forth in claim 3, wherein a third edge of the substrate is made to function as a mounting edge where the apparatus is mounted on an illumination apparatus, and a common pattern at one polarities of the parallel circuits is disposed at a central portion of the mounting edge and two patterns at the other polarities of the parallel circuits are disposed at both end portions of the mounting edge which face each other with the central portion put between the both end portions.

5. A vehicle headlamp, wherein:
the LED light emitting apparatus set forth in claim 1 is disposed with an upper side thereof oriented upwards so that light is emitted upwards from the upper surfaces of the LED chip or to the peripheries of the LED chip;
wherein a reflector is provided at the rear of the LED light emitting apparatus so as to extend around the LED chip so as to reflect forwards the light emitted upwards or to the peripheries of the upper surfaces; and
the LED light emitting apparatus is disposed so that the first orthogonal moving-away direction relative to the first edge of the LED chip constitutes a directly rearward direction which is directed from the LED chip to the reflector such that the first wire installed to extend from the first pad electrode disposed on the first edge side of the LED chip is prevented from entering optical paths directed from the LED chip to the reflector.

6. The LED light emitting apparatus as set forth in claim 1, wherein the first and second pad electrodes have same polarity and the other polarity is provided on a lower surface of the LED chip.

7. The LED light emitting apparatus as set forth in claim 1, wherein the LED chip includes a LLO chip having a conductive support substrate provided on a lower surface of the LLO chip.

8. The LED light emitting apparatus as set forth in claim 1, wherein the substrate has a suction hole in a region in which the LED chip is to be mounted; and the LED chip is joined to the substrate by an AuSn sheet-shaped pre-form that is provided so as to cover the suction hole.

9. The LED light emitting apparatus as set forth in claim 1, wherein a plurality of the LED chips are mounted on the substrate, and a plurality of suction holes are respectively formed in a region of the substrate on which the plurality of LED chips are mounted.

10. The LED light emitting apparatus as set forth in claim 8, wherein an edge of the AuSn sheet-shaped pre-form lies 0.1 to 0.6 mm further inwards of an edge of a joining surface of the LED chip.

11. The LED light emitting apparatus as set forth in claim 8, wherein a thickness of the AuSn sheet-shaped pre-form is 15 to 35 µm.

12. The LED light emitting apparatus as set forth in claim 1, wherein the first wire and the second wire are inclined, from the first orthogonal moving-away direction and the second orthogonal moving-away direction, respectively, toward a same direction which extends parallel with the first and second edge of the LED chip.

13. The LED light emitting apparatus as set forth in claim 1, wherein the conductive pattern is asymmetrical across a center thereof extending parallel with the first edge of the LED chip.

* * * * *